US012744183B2

(12) United States Patent
Prager et al.

(10) Patent No.: US 12,744,183 B2
(45) Date of Patent: Sep. 22, 2026

(54) EFFICIENT ENERGY RECOVERY IN A NANOSECOND PULSER CIRCUIT

(71) Applicant: Eagle Harbor Technologies, Inc., Seattle, WA (US)

(72) Inventors: James Prager, Seattle, WA (US); Timothy Ziemba, Bainbridge Island, WA (US); Kenneth Miller, Seattle, WA (US); Ilia Slobodov, Seattle, WA (US); Morgan Quinley, Seattle, WA (US)

(73) Assignee: Eagle Harbor Technologies, Inc., Seattle, WA (US)

( * ) Notice: Subject to any disclaimer, the term of this patent is extended or adjusted under 35 U.S.C. 154(b) by 374 days.

(21) Appl. No.: 18/413,975

(22) Filed: Jan. 16, 2024

(65) Prior Publication Data

US 2024/0304417 A1 Sep. 12, 2024

Related U.S. Application Data

(63) Continuation of application No. 17/667,531, filed on Feb. 8, 2022, now Pat. No. 11,875,971, which is a (Continued)

(51) Int. Cl.
*H01J 37/32* (2006.01)
*H10P 72/72* (2026.01)

(52) U.S. Cl.
CPC .. *H01J 37/32146* (2013.01); *H01J 37/32091* (2013.01); *H01J 37/32128* (2013.01); (Continued)

(58) Field of Classification Search
CPC ........... H01J 37/32146; H01J 37/32091; H01J 37/32128; H01J 37/32174; H01J 37/32715; H10P 72/722
See application file for complete search history.

(56) References Cited

U.S. PATENT DOCUMENTS 4,070,589 A 1/1978 Holtje
4,438,331 A 3/1984 Davis
(Continued)

FOREIGN PATENT DOCUMENTS

CA 2292526 A1 12/1999
CN 101534071 A 9/2009
(Continued)

OTHER PUBLICATIONS

English translation of Office Action for KR Application No. 20247005060, mailed on Mar. 25, 2024, 22 pages.
(Continued)

*Primary Examiner* — Dharti H Patel

(57) ABSTRACT

Some embodiments include a nanosecond pulser circuit. In some embodiments, a nanosecond pulser circuit may include: a high voltage power supply; a nanosecond pulser electrically coupled with the high voltage power supply and switches voltage from the high voltage power supply at high frequencies; a transformer having a primary side and a secondary side, the nanosecond pulser electrically coupled with the primary side of the transformer; and an energy recovery circuit electrically coupled with the secondary side of the transformer. In some embodiments, the energy recovery circuit comprises: an inductor electrically coupled with the high voltage power supply; a crowbar diode arranged in parallel with the secondary side of the transformer; and a second diode disposed in series with the inductor and arranged to conduct current from a load to the high voltage power supply.

5 Claims, 18 Drawing Sheets

Related U.S. Application Data continuation of application No. 16/737,615, filed on Jan. 8, 2020, now Pat. No. 11,302,518, which is a continuation-in-part of application No. 16/697,173, filed on Nov. 26, 2019, now Pat. No. 11,004,660, and a continuation-in-part of application No. 16/524,967, filed on Jul. 29, 2019, now Pat. No. 10,811,230, which is a continuation of application No. 16/523,840, filed on Jul. 26, 2019, now Pat. No. 10,892,140, said application No. 16/737,615 is a continuation-in-part of application No. 16/523,840, filed on Jul. 26, 2019, now Pat. No. 10,892,140.

(60) Provisional application No. 62/789,523, filed on Jan. 8, 2019, provisional application No. 62/789,526, filed on Jan. 8, 2019, provisional application No. 62/774,078, filed on Nov. 30, 2018, provisional application No. 62/717,523, filed on Aug. 10, 2018, provisional application No. 62/711,464, filed on Jul. 27, 2018, provisional application No. 62/711,406, filed on Jul. 27, 2018, provisional application No. 62/711,334, filed on Jul. 27, 2018, provisional application No. 62/711,468, filed on Jul. 27, 2018, provisional application No. 62/711,347, filed on Jul. 27, 2018, provisional application No. 62/711,457, filed on Jul. 27, 2018, provisional application No. 62/711,467, filed on Jul. 27, 2018.

(52) U.S. Cl.
CPC .. *H01J 37/32174* (2013.01); *H01J 37/32715* (2013.01); *H10P 72/722* (2026.01)

(56) References Cited

U.S. PATENT DOCUMENTS 4,504,895 A 3/1985 Steigerwald
4,885,074 A 12/1989 Susko et al.
4,924,191 A 5/1990 Erb et al.
4,992,919 A 2/1991 Lee et al.
5,072,191 A 12/1991 Nakajima et al.
5,118,969 A 6/1992 Ikezi et al.
5,140,510 A 8/1992 Myers
5,313,481 A 5/1994 Cook et al.
5,321,597 A 6/1994 Alacoque
5,325,021 A 6/1994 Duckworth et al.
5,392,043 A 2/1995 Ribner
5,418,707 A 5/1995 Shimer et al.
5,451,846 A 9/1995 Peterson et al.
5,488,552 A 1/1996 Sakamoto et al.
5,610,452 A 3/1997 Shimer et al.
5,623,171 A 4/1997 Nakajima
5,656,123 A 8/1997 Salimian et al.
5,729,562 A 3/1998 Birx et al.
5,796,598 A 8/1998 Nowak et al.
5,808,504 A 9/1998 Chikai et al.
5,905,646 A 5/1999 Crewson et al.
5,930,125 A 7/1999 Hitchcock et al.
5,933,335 A 8/1999 Hitchcock et al.
5,968,377 A 10/1999 Yuasa et al.
6,059,935 A 5/2000 Spence
6,066,901 A 5/2000 Burkhart et al.
6,087,871 A 7/2000 Kardo-Syssoev et al.
6,205,074 B1 3/2001 Van Buskirk et al.
6,233,161 B1 5/2001 Balakrishnan et al.
6,238,387 B1 5/2001 Miller, III
6,253,704 B1 7/2001 Savas
6,359,542 B1 3/2002 Widmayer et al.
6,362,604 B1 3/2002 Cravey
6,392,187 B1 5/2002 Johnson
6,416,638 B1 7/2002 Kuriyama et al.
6,480,399 B2 11/2002 Balakrishnan et al.
6,483,731 B1 11/2002 Isurin et al.
6,496,047 B1 12/2002 Iskander et al.
6,577,135 B1 6/2003 Matthews et al.
6,741,120 B1 5/2004 Tan
6,741,484 B2 5/2004 Crewson et al.
6,831,377 B2 12/2004 Yampolsky et al.
6,897,574 B2 5/2005 Vaysse
6,947,300 B2 9/2005 Pai et al.
7,061,230 B2 6/2006 Kleine et al.
7,180,082 B1 2/2007 Hassanein et al.
7,256,637 B2 8/2007 Iskander et al.
7,291,545 B2 11/2007 Collins et al.
7,307,375 B2 12/2007 Smith et al.
7,319,579 B2 1/2008 Inoue et al.
7,354,501 B2 4/2008 Gondhalekar et al.
7,396,746 B2 7/2008 Walther et al.
7,492,138 B2 2/2009 Zhang et al.
7,512,433 B2 3/2009 Bernhart et al.
7,521,370 B2 4/2009 Hoffaman
7,601,619 B2 10/2009 Okumura et al.
7,605,385 B2 10/2009 Bauer
7,767,433 B2 8/2010 Kuthi et al.
7,901,930 B2 3/2011 Kuthi et al.
7,936,544 B2 5/2011 Beland
7,948,185 B2 5/2011 Smith et al.
7,989,987 B2 8/2011 McDonald
8,093,979 B2 1/2012 Wilson
8,115,343 B2 2/2012 Sanders et al.
8,129,653 B2 3/2012 Kirchmeier et al.
8,143,790 B2 3/2012 Smith et al.
8,222,936 B2 7/2012 Friedman et al.
8,259,476 B2 9/2012 Ben-Yaakov et al.
8,410,889 B2 4/2013 Garrity et al.
8,436,602 B2 5/2013 Sykes
8,450,985 B2 5/2013 Gray et al.
8,575,843 B2 11/2013 Moore et al.
8,723,591 B2 5/2014 Lee et al.
8,773,184 B1 7/2014 Petrov et al.
8,828,254 B2 9/2014 Inoue et al.
8,847,433 B2 9/2014 Vandermey
8,963,377 B2 2/2015 Ziemba et al.
9,067,788 B1 6/2015 Spielman et al.
9,070,396 B1 6/2015 Katchmart et al.
9,084,334 B1 7/2015 Gefter et al.
9,122,350 B2 9/2015 Kao et al.
9,287,086 B2 3/2016 Brouk et al.
9,287,092 B2 3/2016 Brouk et al.
9,306,533 B1 4/2016 Mavretic
9,329,256 B2 5/2016 Dolce
9,349,603 B2 5/2016 Inoue et al.
9,417,739 B2 8/2016 Cordeiro et al.
9,435,029 B2 9/2016 Brouk et al.
9,493,765 B2 11/2016 Krishnaswamy et al.
9,601,283 B2 3/2017 Ziemba et al.
9,706,630 B2 7/2017 Miller et al.
9,767,988 B2 9/2017 Brouk et al.
9,960,763 B2 5/2018 Miller et al.
10,009,024 B2 6/2018 Gan et al.
10,020,800 B2 7/2018 Prager et al.
10,027,314 B2 7/2018 Prager et al.
10,044,278 B2 8/2018 Kondo et al.
10,224,822 B2 3/2019 Miller et al.
10,301,587 B2 5/2019 Krishnaswamy et al.
10,304,661 B2 5/2019 Ziemba et al.
10,373,755 B2 8/2019 Prager et al.
10,373,804 B2 * 8/2019 Koh .................. H01J 37/32027
10,382,022 B2 8/2019 Prager et al.
10,448,494 B1 10/2019 Dorf et al.
10,448,495 B1 10/2019 Dorf et al.
10,460,910 B2 10/2019 Ziemba et al.
10,460,911 B2 10/2019 Ziemba et al.
10,483,089 B2 11/2019 Ziemba et al.
10,510,575 B2 * 12/2019 Kraus ..................... H01J 37/00
10,555,412 B2 2/2020 Dorf et al.
10,600,619 B2 3/2020 Inoue et al.
10,607,814 B2 3/2020 Ziemba et al.
10,659,019 B2 5/2020 Slobodov et al.
10,707,864 B2 7/2020 Miller et al.
10,734,906 B2 8/2020 Miller et al.

(56) References Cited

U.S. PATENT DOCUMENTS 10,777,388 B2 9/2020 Ziemba et al.
10,791,617 B2 9/2020 Dorf et al.
10,796,887 B2 10/2020 Prager et al.
10,811,230 B2 10/2020 Ziemba et al.
10,892,140 B2 1/2021 Ziemba et al.
10,892,141 B2 1/2021 Ziemba et al.
10,978,955 B2 4/2021 Ziemba et al.
11,004,660 B2 5/2021 Prager et al.
11,171,568 B2 11/2021 Miller et al.
11,284,500 B2 3/2022 Dorf et al.
11,302,518 B2 4/2022 Prager et al.
2001/0008552 A1 7/2001 Harada et al.
2002/0016617 A1 2/2002 Oldham
2002/0140464 A1 10/2002 Yampolsky et al.
2002/0180276 A1 12/2002 Sakuma et al.
2002/0186577 A1 12/2002 Kirbie
2003/0021125 A1 1/2003 Rufer et al.
2003/0058160 A1 3/2003 Kitabatake et al.
2003/0071035 A1 4/2003 Brailove
2003/0137791 A1 7/2003 Arnet et al.
2003/0169107 A1 9/2003 LeChevalier
2003/0227280 A1 12/2003 Vinciarelli
2004/0085784 A1 5/2004 Salama et al.
2004/0149217 A1 8/2004 Collins et al.
2005/0152159 A1 7/2005 Isurin et al.
2005/0270096 A1 12/2005 Coleman
2006/0187607 A1 8/2006 Mo
2006/0192774 A1 8/2006 Yasumura
2006/0210020 A1 9/2006 Takahashi et al.
2006/0274887 A1 12/2006 Sakamoto et al.
2007/0018504 A1 1/2007 Wiener et al.
2007/0114981 A1 5/2007 Vasquez et al.
2007/0115705 A1 5/2007 Gotzenberger et al.
2007/0188104 A1 8/2007 Chistyakov et al.
2007/0212811 A1 9/2007 Hanawa et al.
2008/0062733 A1 3/2008 Gay
2008/0106151 A1 5/2008 Ryoo et al.
2008/0143260 A1 6/2008 Tuymer
2008/0198634 A1 8/2008 Scheel et al.
2008/0231337 A1 9/2008 Krishnaswamy et al.
2008/0252225 A1 10/2008 Kurachi et al.
2008/0272706 A1 11/2008 Kwon et al.
2009/0016549 A1 1/2009 French et al.
2009/0108759 A1 4/2009 Tao et al.
2009/0219071 A1 9/2009 Tao et al.
2009/0322307 A1 12/2009 Ide
2010/0007358 A1 1/2010 Schaerrer et al.
2010/0148847 A1 6/2010 Schurack et al.
2010/0284208 A1 11/2010 Nguyen et al.
2011/0001438 A1 1/2011 Chemel et al.
2011/0140607 A1 6/2011 Moore et al.
2012/0016282 A1 1/2012 Van Brunt et al.
2012/0052599 A1 3/2012 Brouk et al.
2012/0081350 A1 4/2012 Sano et al.
2012/0155613 A1 6/2012 Caiafa et al.
2012/0228263 A1* 9/2012 Ui .................... H01J 37/32091 156/345.44
2013/0027848 A1 1/2013 Said
2013/0029492 A1 1/2013 Inoue et al.
2013/0075390 A1 3/2013 Ashida
2013/0113650 A1 5/2013 Behbahani et al.
2013/0146443 A1 6/2013 Papa et al.
2013/0174105 A1 7/2013 Nishio et al.
2013/0175575 A1 7/2013 Ziemba et al.
2013/0181629 A1* 7/2013 Urushihara ............. H05H 1/52 315/223
2013/0213935 A1* 8/2013 Liao ......................... C23F 1/00 216/67
2013/0320953 A1 12/2013 Cassel et al.
2014/0009969 A1 1/2014 Yuzurihara et al.
2014/0021180 A1 1/2014 Vogel
2014/0077611 A1 3/2014 Young et al.
2014/0109886 A1 4/2014 Singleton et al.
2014/0118414 A1 5/2014 Seo et al.
2014/0146571 A1 5/2014 Ryoo et al.
2014/0268968 A1 9/2014 Richardson
2014/0349418 A1 11/2014 Inoue et al.
2014/0354343 A1 12/2014 Ziemba et al.
2015/0028932 A1 1/2015 Ziemba et al.
2015/0076372 A1 3/2015 Ziemba et al.
2015/0084509 A1 3/2015 Yuzurihara et al.
2015/0130525 A1 5/2015 Miller et al.
2015/0155086 A1 6/2015 Matsuura
2015/0256086 A1 9/2015 Miller et al.
2015/0303914 A1 10/2015 Ziemba et al.
2015/0311680 A1 10/2015 Burrows et al.
2015/0318846 A1 11/2015 Prager et al.
2016/0020072 A1* 1/2016 Brouk ............... H01J 37/32137 156/345.28
2016/0220670 A1 8/2016 Kalghatgi et al.
2016/0225587 A1 8/2016 Inoue et al.
2016/0241234 A1 8/2016 Mavretic
2016/0269195 A1 9/2016 Coenen et al.
2016/0327029 A1 11/2016 Ziemba et al.
2016/0327089 A1 11/2016 Adam et al.
2017/0083810 A1 3/2017 Ielmini et al.
2017/0126049 A1 5/2017 Pan et al.
2017/0154726 A1 6/2017 Prager et al.
2017/0243731 A1 8/2017 Ziemba et al.
2017/0294842 A1 10/2017 Miller et al.
2017/0311431 A1 10/2017 Park
2017/0359886 A1 12/2017 Binderbauer et al.
2018/0226896 A1 8/2018 Miller et al.
2018/0286636 A1 10/2018 Ziemba et al.
2018/0315581 A1 11/2018 Hayami et al.
2018/0315583 A1 11/2018 Luere et al.
2018/0374689 A1 12/2018 Abraham et al.
2019/0080884 A1 3/2019 Ziemba et al.
2019/0088518 A1 3/2019 Koh et al.
2019/0131110 A1 5/2019 Ziemba et al.
2019/0157044 A1 5/2019 Ziemba et al.
2019/0172685 A1 6/2019 Van Zyl et al.
2019/0180982 A1 6/2019 Brouk et al.
2019/0228952 A1* 7/2019 Dorf ................. H01J 37/32091
2019/0326092 A1* 10/2019 Ogasawara ....... H01J 37/32091
2019/0348258 A1 11/2019 Koh et al.
2019/0350072 A1 11/2019 Dorf et al.
2019/0393791 A1 12/2019 Ziemba et al.
2020/0035458 A1* 1/2020 Ziemba ............. H01J 37/32082
2020/0035459 A1* 1/2020 Ziemba ............. H01J 37/32082
2020/0043702 A1 2/2020 Ziemba et al.
2020/0051786 A1 2/2020 Ziemba et al.
2020/0154556 A1 5/2020 Dorf et al.
2020/0161092 A1 5/2020 Inoue et al.
2020/0168436 A1 5/2020 Ziemba et al.
2020/0352017 A1 11/2020 Dorf et al.
2020/0378605 A1 12/2020 Lacoste
2020/0396820 A1 12/2020 de Vries et al.
2021/0152163 A1 5/2021 Miller et al.
2024/0282552 A1* 8/2024 Miller ............... H01J 37/32146

FOREIGN PATENT DOCUMENTS

CN 103458600 B 7/2016
CN 106537776 A 3/2017
EP 0174164 A2 3/1986
EP 0947048 A1 10/1999
EP 1128557 A2 8/2001
EP 1515430 A1 3/2005
JP H03225979 A 10/1991
JP H05288829 A 11/1993
JP H09129621 A 5/1997
JP 2000323772 A 11/2000
JP 2003087099 A 3/2003
JP 2004006147 A 1/2004
JP 2004343848 A 12/2004
JP 2007181375 A 7/2007
JP 2011151643 A 8/2011
JP 2014036502 A 2/2014
WO 0193419 A1 12/2001
WO 2010069317 A1 6/2010
WO 2012153764 A1 11/2012

(56) References Cited

FOREIGN PATENT DOCUMENTS

| | | | |
|---|---|---|---|
| WO | 2014036000 | A1 | 3/2014 |
| WO | 2016171582 | A1 | 10/2016 |
| WO | 2018186901 | A1 | 10/2018 |

OTHER PUBLICATIONS

English translation of Office Action for JP Application No. 2023-119845, mailed on Jun. 11, 2024, 12 pages.
Notice of Allowance in U.S. Appl. No. 16/523,840, dated Dec. 4, 2020, 11 pages.
Notice of Allowance in U.S. Appl. No. 16/555,948, dated Jan. 13, 2021, 7 pages.
Notice of Allowance in U.S. Appl. No. 16/457,791 dated Jan. 22, 2021, 7 pages.
International Search Report and written opinion received for PCT Patent Application No. PCT/US2020/60799, mailed in Feb. 5, 2021, 11 pages.
Extended European Search Report for Application No. 20195265.2, 8 pages.
Notice of Allowance in U.S. Appl. No. 16/722,115, dated Apr. 1, 2021, 9 pages.
Notice of Allowance in U.S. Appl. No. 15/889,586 dated Apr. 14, 2021, 9 pages.
Non Final Office Action in U.S. Appl. No. 16/941,532, dated Apr. 14, 2021, 10 pages.
Extended European Search Report for Application No. 20200919.7, 11 pages.
Non-Final Office Action in U.S. Appl. No. 16/722,115, dated May 3, 2021, 9 pages.
Non-Final Office Action in U.S. Appl. No. 15/889,586 dated Jun. 11, 2021, 11 pages.
International Preliminary Report on Patentability in connection with International Patent Application No. PCT/US2020/012641, mailed Jun. 16, 2021, 11 pages.
Non-Final Office Action in U.S. Appl. No. 17/033,662 dated Sep. 1, 2021, 17 pages.
Notice of Allowance in U.S. Appl. No. 16/737,615 dated Nov. 24, 2021, 11 pages.
Final Office Action in U.S. Appl. No. 17/033,662 dated Dec. 8, 2021, 17 pages.
Non-Final Office Action in U.S. Appl. No. 17/213,230 dated Dec. 14, 2021, 6 pages.
English translation of Office Action for Taiwan application No. 109100609 mailed Dec. 16, 2021, 5 pages.
Non-Final Office Action in U.S. Appl. No. 17/163,331 dated Mar. 4, 2022, 23 pages.
Notice of Allowance in U.S. Appl. No. 17/098,207 dated Jan. 5, 2023, 15 pages.
Notice of Allowance in U.S. Appl. No. 17/033,662, dated Feb. 7, 2023, 9 pages.
Non-Final Office Action in U.S. Appl. No. 17/667,531, dated Feb. 16, 2023, 06 pages.
Notice of Allowance in U.S. Appl. No. 17/667,531, dated Oct. 4, 2023, 09 pages.
Notice of Allowance in U.S. Appl. No. 15/623,464, dated Oct. 17, 2018, 7 pages.
International Search Report and Written Opinion as issued in connection with International Patent Application No. PCT/US2018/048206, mailed Nov. 1, 2018, 10 pages.
Non Final Office Action in U.S. Appl. No. 15/941,731, dated Nov. 16, 2018, 17 pages.
Non-Final Office Action in U.S. Appl. No. 15/921,650 dated Nov. 28, 2018, 11 pages.
Non Final Office Action in U.S. Appl. No. 16/178,538, dated Jan. 11, 2019, 27 pages.
Non Final Office Action in U.S. Appl. No. 16/250,765, dated Mar. 29, 2019, 11 pages.
Notice of Allowance in U.S. Appl. No. 16/114,195, dated Apr. 3, 2019, 9 pages.
Notice of Allowance in U.S. Appl. No. 15/921,650 dated Apr. 4, 2019, 7 pages.
Non Final Office Action in U.S. Appl. No. 16/178,565, dated Apr. 4, 2019, 10 pages.
Final Office Action in U.S. Appl. No. 15/889,586 dated May 2, 2019, 19 pages.
Final Office Action in U.S. Appl. No. 15/941,731, dated May 3, 2019, 16 pages.
Final Office Action in U.S. Appl. No. 16/178,538 dated Jun. 7, 2019, 17 pages.
Notice of Allowance in U.S. Appl. No. 16/250,765, dated. Jul. 10, 2019, 9 pages.
Final Office Action in U.S. Appl. No. 16/178,565, dated Jul. 12, 2019, 11 pages.
Notice of Allowance in U.S. Appl. No. 16/178,538 dated Jul. 17, 2019, 10 pages.
Notice of Allowance in U.S. Appl. No. 15/941,731, dated Jul. 17, 2019, 12 pages.
Non-Final Office Action in U.S. Appl. No. 15/889,586 dated Sep. 6, 2019, 17 pages.
International Preliminary Report on Patentability in connection with International Patent Application No. PCT/US2018/025440, mailed Oct. 1, 2019, 10 pages.
International Search Report and Written Opinion as issued in connection with International Patent Application No. PCT/US2019/043933, mailed Oct. 25, 2019, 9 pages.
Notice of Allowance in U.S. Appl. No. 16/178,565, dated Nov. 14, 2019, 5 pages.
Non Final Office Action in U.S. Appl. No. 15/945,722, dated Nov. 15, 2019, 13 pages.
International Search Report and Written Opinion as issued in connection with International Patent Application No. PCT/US2019/043932, mailed Dec. 5, 2019, 16 pages.
International Search Report and Written Opinion as issued in connection with International Patent Application No. PCT/US2019/043988, mailed Dec. 10, 2019, 13 pages.
Non Final Office Action in U.S. Appl. No. 16/250,157 dated Dec. 19, 2019, 6 pages.
Non-Final Office Action in U.S. Appl. No. 16/599,318, dated Jan. 16, 2020, 11 pages.
Non-Final Office Action in U.S. Appl. No. 16/722,085, dated Mar. 6, 2020, 5 pages.
Final Office Action in U.S. Appl. No. 15/889,586 dated Mar. 18, 2020, 18 pages.
Non-Final Office Action in U.S. Appl. No. 16/523,840, dated Mar. 19, 2020, 6 pages.
Notice of Allowance in U.S. Appl. No. 15/945,722, dated Apr. 3, 2020, 7 pages.
Non-Final Office Action in U.S. Appl. No. 16/736,971, dated Apr. 7, 2020, 14 pages.
Notice of Allowance in U.S. Appl. No. 16/250,157 dated Apr. 13, 2020, 8 pages.
Non-Final Office Action in U.S. Appl. No. 16/457,791 dated Apr. 15, 2020, 12 pages.
Final Office Action in U.S. Appl. No. 16/736,971, dated Apr. 17, 2020, 6 pages.
International Search Report and Written Opinion as issued in connection with International Patent Application No. PCT/US2020/016253, mailed Apr. 29, 2020, 7 pages.
Advisory Action in U.S. Appl. No. 16/736,971, dated May 12, 2020, 5 pages.
Non-Final Office Action in U.S. Appl. No. 16/722,115, dated May 14, 2020, 6 pages.
Non-Final Office Action in U.S. Appl. No. 16/555,948, dated May 15, 2020, 8 pages.
International Search Report and Written Opinion as issued in connection with International Patent Application No. PCT/US2020/012641, mailed May 28, 2020, 15 pages.
Extended European Search Report for Application No. 18848041.2, 9 pages.

(56) References Cited

OTHER PUBLICATIONS

Final Office Action in U.S. Appl. No. 16/523,840, dated Jun. 26, 2020, 5 pages.
Notice of Allowance in U.S. Appl. No. 16/736,971, dated Jun. 30, 2020, 14 pages.
Advisory Action in U.S. Appl. No. 15/889,586 dated Jul. 10, 2020, 4 pages.
Notice of Allowance in U.S. Appl. No. 16/722,085, dated Jul. 16, 2020, 8 pages.
Final Office Action in U.S. Appl. No. 16/599,318, dated Jul. 23, 2020, 14 pages.
Notice of Allowance in U.S. Appl. No. 16/599,318, dated Aug. 4, 2020, 8 pages.
Non Final Office Action in U.S. Appl. No. 16/537,513, dated Sep. 3, 2020, 13 pages.
Non-Final Office Action in U.S. Appl. No. 15/889,586 dated Sep. 18, 2020, 19 pages.
Notice of Allowance in U.S. Appl. No. 16/523,840, dated Sep. 30, 2020, 11 pages.
Non Final Office Action in U.S. Appl. No. 16/903,374, dated Nov. 25, 2020, 16 pages.
Final Office Action in U.S. Appl. No. 16/722,115, dated Dec. 2, 2020, 7 pages.
Bland, M.J., et al., "A High Power RF Power Supply for High Energy Physics Applications," Proceedings of 2005 the Particle Accelerator Conference, IEEE pp. 4018-4020 (May 16-20, 2005).
Dammertz, G., et al., "Development of Multimegawatt Gyrotrons for Fusion Plasma Heating and current Drive," IEEE Transactions on Electron Devices, vol. 52, No. 5, pp. 808-817 (Apr. 2005) (Abstract).
Garwin, R., "Pulsed Power Peer Review Committee Report," Sandia National Laboratories Report, SAND2000-2515, pp. 3-38 (Oct. 2000).
Gaudet, J.A., et al., "Research issues in Developing Compact Pulsed Power for High Peak Power Applications on Mobile Platforms," Proceedings of the IEEE, vol. 92, No. 7, pp. 1144-1165 (Jul. 2004).
Goodman, E. A., "Characteristics of sheet windings in transformers", IEEE Engineering, vol. 82, No. 11, pp. 673-676 (Nov. 1963) (Abstract).
In, Y., et al., "On the roles of direct feedback and error field correction in stabilizing resistive-wall modes," Nuclear 2 Fusion, vol. 50, No. 4, pp. 1-5 (2010).
Kim, J.H., et al., "High Voltage Pulsed Power Supply Using IGBT Stacks," IEEE Transactions on Dielectrics and Electrical insulation, vol. 14, No. 4, pp. 921-926 (Aug. 2007).
Locher, R., "Introduction to Power MOSFETs and their Applications (Application Note 558)," Fairchild Semiconductor, 15 pages (Oct. 1998).
Locher, R.E., and Pathak, A.D., "Use of BiMOSFETs in Modern Radar Transmitters," IEEE International Conference on Power Electronics and Drive Systems, pp. 776-782 (2001).
Pokryvailo, A., et al., "A 1KW Pulsed Corona System for Pollution Control Applications," 14th IEEE International Pulsed Power Conference, Dallas, TX, USA (Jun. 15-18, 2003).
Pokryvailo, A., et al., "High-Power Pulsed Corona for Treatment of Pollutants in Heterogeneous Media," IEEE Transactions on Plasma Science, vol. 34, No. 5, pp. 1731-1743 (Oct. 2006) (Abstract).
Prager, J.R et al., "A High Voltage Nanosecond Pulser with Variable Pulse Width and Pulse Repetition Frequency control for Nonequilibrium Plasma Applications", 41st International Conference on Plasma Sciences held with 2014 IEEE International Conference on High-Power Particle Beams, May 25-29, 2014, 6, Washington, D.C.
Quinley, M., et al., "High Voltage Nanosecond Pulser Operating at 30 KW and 400 KHz" APS-GEC-2018, 1 page (2018).
Rao, X., et al., "Combustion Dynamics of Plasma-Enhanced Premixed and Nonpremixed Flames," IEEE Transactions on Plasma Science, vol. 38, No. 12, pp. 3265-3271 (Dec. 2010).
Reass, W.A., et al., "Progress Towards a 20 KV, 2 KA Plasma Source Ion Implantation Modulator for Automotive Production of Diamond Film on Aluminum," Submitted to 22nd International Power Symposium, Boca Raton, FL, 6 pages (Jun. 24-27, 1996).
Sanders, J.M., et al., "Scalable, compact, nanosecond pulse generator with a high repetition rate for biomedical applications requiring intense electric fields," 2009 IEEE Pulsed Power Conference, Washington, DC, 2 pages (Jun. 28, 2009-Jul. 2, 2009) (Abstract).
Schamiloglu, E., et al., "Scanning the Technology: Modem Pulsed Power: Charlie Martin and Beyond," Proceedings of the IEEE, vol. 92, No. 7 , pp. 1014-1020 (Jul. 2004).
Scoville, J.T., et al., "The Resistive Wall Mode Feedback Control System on Diii-D," IEEE/NPSS 18th Symposium on fusion Engineering, Albuquerque, NM, Oct. 25-29, 1999, General Atomics Report GAA23256, 7 pages (Nov. 1999).
Singleton, D.R., et al., "Compact Pulsed-Power System for Transient Plasma Ignition," IEEE Transactions on Plasma Science, vol. 37, No. 12, pp. 2275-2279 (2009) (Abstract).
Singleton, D.R., et al., "Low Energy Compact Power Modulators for Transient Plasma Ignition," IEEE Transactions on Dielectrics and Electrical Insulation, vol. 18, No. 4, pp. 1084-1090 (Aug. 2011) (Abstract).
Starikovskiy, A., and Aleksandrov, N., "Plasma-assisted ignition and combustion," Progress in Energy and Combustion Science, vol. 39, No. 1, pp. 61-110 (Feb. 2013).
Wang, F., et al., "Compact High Repetition Rate Pseudospark Pulse Generator," IEEE Transactions on Plasma Science, vol. 33, No. 4, pp. 1177-1181 (Aug. 2005) (Abstract).
Zavadtsev, D.A., et al., "Compact Electron Linear Accelerator RELUS-5 for Radiation Technology Application," 10th European Particle Accelerator Conference, Edinburgh, UK, pp. 2385-2387 (Jun. 26-30, 2006).
Zhu, Z., et al., "High Voltage pulser with a fast fall-time for plasma immersion ion implantation," Review of Scientific Instruments, vol. 82, No. 4, pp. 045102-1-045102-4 (Apr. 2011).
International Search Report and Written Opinion as issued in connection with International Patent Application No. PCT/US2014/040929, mailed Sep. 15, 2014, 10 pages.
International Search Report and Written Opinion as issued in connection with International Patent Application No. PCT/US2014/065832, mailed Feb. 20, 2015, 13 pages.
International Search Report and Written Opinion as issued in connection with International Patent Application No. PCT/US2015/018349, mailed Jul. 14, 2015, 15 pages.
International Search Report and Written Opinion as issued in connection with International Patent Application No. PCT/US2015/040204, mailed Oct. 6, 2015, 12 pages.
Non-Final Office Action in U.S. Appl. No. 14/542,487 dated Nov. 23, 2015, 11 pages.
Non-Final Office Action in U.S. Appl. No. 14/798,154 dated Jan. 5, 2016, 13 pages.
Final Office Action in U.S. Appl. No. 14/542,487 dated Feb. 12, 2016, 11 pages.
Non-Final Office Action in U.S. Appl. No. 14/542,487 dated Apr. 8, 2016, 12 pages.
Non Final Office Action in U.S. Appl. No. 14/635,991, dated Jul. 29, 2016, 17 pages.
Final Office Action in U.S. Appl. No. 14/798,154 dated Oct. 6, 2016, 14 pages.
Final Office Action in U.S. Appl. No. 14/542,487 dated Dec. 12, 2016, 13 pages.
Final Office Action in U.S. Appl. No. 14/635,991, dated Jan. 23, 2017, 22 pages.
Advisory Action in U.S. Appl. No. 14/542,487 dated Mar. 28, 2017, 03 pages.
Notice of Allowance in U.S. Appl. No. 14/635,991, dated May 4, 2017, 07 pages.
Non-Final Office Action in U.S. Appl. No. 14/798,154 dated May 26, 2017, 16 pages.
Non-Final Office Action in U.S. Appl. No. 14/542,487 dated Jun. 5, 2017, 12 pages.
Partial Supplementary European Search Report in related foreign application No. 14861818.4, 12 Pages.
Non Final Office Action in U.S. Appl. No. 15/623,464, dated Nov. 7, 2017, 18 pages.

(56) References Cited

OTHER PUBLICATIONS

Final Office Action in U.S. Appl. No. 14/542,487 dated Dec. 19, 2017, 07 pages.
Final Office Action in U.S. Appl. No. 14/798,154 dated Dec. 28, 2017, 06 pages.
Notice of Allowance in U.S. Appl. No. 14/542,487 dated Mar. 21, 2018, 05 pages.
Final Office Action in U.S. Appl. No. 15/623,464, dated Mar. 27, 2018, 18 pages.
International Search Report and Written Opinion as issued in connection with International Patent Application No. PCT/US2018/016993, mailed Apr. 18, 2018, 11 pages.
Non-Final Office Action in U.S. Appl. No. 15/889,586 dated Sep. 12, 2018, 18 pages.
Notice of Allowance in U.S. Appl. No. 14/798,154 dated Jun. 1, 2018, 05 pages.
International Search Report and Written Opinion as issued in connection with International Patent Application No. PCT/US2018/025440, mailed Jun. 25, 2018, 25 pages.

* cited by examiner

EFFICIENT ENERGY RECOVERY IN A NANOSECOND PULSER CIRCUIT

CROSS-REFERENCE TO RELATED APPLICATIONS

This application claims priority to U.S. Provisional Patent Application No. 62/789,526 filed Jan. 8, 2019, titled "EFFICIENT ENERGY RECOVERY IN A NANOSECOND PULSER CIRCUIT," which is incorporated by reference in its entirety.

This application claims priority to U.S. Provisional Patent Application No. 62/789,523 filed Jan. 8, 2019, titled "EFFICIENT NANOSECOND PULSER WITH SOURCE AND SINK CAPABILITY FOR PLASMA CONTROL APPLICATIONS," which is incorporated by reference in its entirety.

This application is a continuation-in-part of and claims priority to U.S. patent application Ser. No. 16/697,173 filed Nov. 27, 2019, titled "VARIABLE OUTPUT IMPEDANCE RF GENERATOR," which is incorporated by reference in its entirety, and which claims priority to U.S. Provisional Patent Application No. 62/774,078 filed Nov. 30, 2018, titled "VARIABLE OUTPUT IMPEDANCE RF GENERATOR," which is incorporated by reference in its entirety.

This application is a continuation-in-part of and claims priority to U.S. patent application Ser. No. 16/523,840 filed Jul. 26, 2019, titled "NANOSECOND PULSER BIAS COMPENSATION," which is incorporated by reference in its entirety, which claims priority to U.S. Provisional Patent Application No. 62/711,464 filed Jul. 27, 2018, titled "NANOSECOND PULSER SYSTEM," and claims priority to U.S. Provisional Patent Application No. 62/711,334 filed Jul. 27, 2018, titled "NANOSECOND PULSER THERMAL MANAGEMENT," and claims priority to U.S. Provisional Patent Application No. 62/711,457 filed Jul. 27, 2018, titled "NANOSECOND PULSER PULSE GENERATION," and claims priority to U.S. Provisional Patent Application No. 62/711,347 filed Jul. 27, 2018, titled "NANOSECOND PULSER ADC SYSTEM," and claims priority to U.S. Provisional Patent Application No. 62/711,467 filed Jul. 27, 2018, titled "EDGE RING POWER SYSTEM," and claims priority to U.S. Provisional Patent Application No. 62/711,406 filed Jul. 27, 2018, titled "NANOSECOND PULSER BIAS COMPENSATION," and claims priority to U.S. Provisional Patent Application No. 62/711,468 filed Jul. 27, 2018, titled "NANOSECOND PULSER CONTROL MODULE," and claims priority to U.S. Provisional Patent Application No. 62/711,523 filed Aug. 10, 2018, titled "PLASMA SHEATH CONTROL FOR RF PLASMA REACTORS," and claims priority to U.S. Provisional Patent Application No. 62/789,523 filed Jan. 1, 2019, titled "EFFICIENT NANOSECOND PULSER WITH SOURCE AND SINK CAPABILITY FOR PLASMA CONTROL APPLICATIONS," and claims priority to U.S. Provisional Patent Application No. 62/789,526 filed Jan. 1, 2019, titled "EFFICIENT ENERGY RECOVERY IN A NANOSECOND PULSER CIRCUIT," and claims priority to and is a continuation-in-part of U.S. Non-Provisional patent application Ser. No. 16/523,840 filed Jul. 26, 2019, titled "NANOSECOND PULSER BIAS COMPENSATION," which is incorporated by reference in its entirety.

This application is a continuation-in-part of and claims priority to U.S. patent application Ser. No. 16/524,967 filed Jul. 29, 2019, titled "SPATIALLY VARIABLE WAFER BIAS POWER SYSTEM," which claims priority to U.S. Provisional Patent Application No. 62/711,464 filed Jul. 27, 2018, titled "NANOSECOND PULSER SYSTEM," and claims priority to U.S. Provisional Patent Application No. 62/711,334 filed Jul. 27, 2018, titled "NANOSECOND PULSER THERMAL MANAGEMENT," and claims priority to U.S. Provisional Patent Application No. 62/711,457 filed Jul. 27, 2018, titled "NANOSECOND PULSER PULSE GENERATION," and claims priority to U.S. Provisional Patent Application No. 62/711,347 filed Jul. 27, 2018, titled "NANOSECOND PULSER ADC SYSTEM," and claims priority to U.S. Provisional Patent Application No. 62/711,467 filed Jul. 27, 2018, titled "EDGE RING POWER SYSTEM," and claims priority to U.S. Provisional Patent Application No. 62/711,406 filed Jul. 27, 2018, titled "NANOSECOND PULSER BIAS COMPENSATION," and claims priority to U.S. Provisional Patent Application No. 62/711,468 filed Jul. 27, 2018, titled "NANOSECOND PULSER CONTROL MODULE," and claims priority to U.S. Provisional Patent Application No. 62/711,523 filed Aug. 10, 2018, titled "PLASMA SHEATH CONTROL FOR RF PLASMA REACTORS," and claims priority to U.S. Provisional Patent Application No. 62/789,523 filed Jan. 1, 2019, titled "EFFICIENT NANOSECOND PULSER WITH SOURCE AND SINK CAPABILITY FOR PLASMA CONTROL APPLICATIONS," and claims priority to U.S. Provisional Patent Application No. 62/789,526 filed Jan. 1, 2019, titled "EFFICIENT ENERGY RECOVERY IN A NANOSECOND PULSER CIRCUIT," and claims priority to and is a continuation-in-part of U.S. Non-Provisional patent application Ser. No. 16/523,840 filed Jul. 26, 2019, titled "NANOSECOND PULSER BIAS COMPENSATION," which is incorporated by reference in its entirety.

BACKGROUND

Producing high voltage pulses with fast rise times and/or fast fall times is challenging. For instance, to achieve a fast rise time and/or a fast fall time (e.g., less than about 50 ns) for a high voltage pulse (e.g., greater than about 5 kV), the slope of the pulse rise and/or fall must be incredibly steep (e.g., greater than 10-11 V/s). Such steep rise times and/or fall times are very difficult to produce especially in circuits driving capacitive loads. Such pulse may be especially difficult to produce using standard electrical components in a compact manner; and/or with pulses having variable pulse widths, voltages, and repetition rates; and/or within applications having capacitive loads such as, for example, a plasma.

SUMMARY

Some embodiments include a nanosecond pulser circuit. In some embodiments, a nanosecond pulser circuit may include: a high voltage power supply; a nanosecond pulser electrically coupled with the high voltage power supply and switches voltage from the high voltage power supply at high frequencies; a transformer having a primary side and a secondary side, the nanosecond pulser electrically coupled with the primary side of the transformer; and an energy recovery circuit electrically coupled with the secondary side of the transformer. In some embodiments, the energy recovery circuit comprises: an inductor electrically coupled with the high voltage power supply; a crowbar diode arranged in parallel with the secondary side of the transformer; and a second diode disposed in series with the inductor and arranged to conduct current from a load to the high voltage power supply.

In some embodiments, the energy recover inductor comprises an inductance of greater than about 50 μH.

In some embodiments, the nanosecond pulser switches voltage from the high voltage power supply at frequencies greater than about 100 kHz. In some embodiments, the nanosecond pulser switches voltage from the high voltage power supply at frequencies from about 0 kHz to about 500 kHz. In some embodiments, the nanosecond pulser circuit provides voltage greater than about 5 kV to a load.

In some embodiments, the energy recovery circuit comprises a switch. In some embodiments, the energy recovery circuit further comprises a high voltage switch in series with the second diode and the inductor. In some embodiments, the high voltage switch switches voltages greater than about 5 kV.

In some embodiments, the load comprises a capacitive load. In some embodiments, the load comprises a plasma deposition chamber.

In some embodiments, the high voltage power supply provides DC power with a voltage greater than 500 V, 750 V, 1 kV, 1.5 kV, etc.

Some embodiments include circuit comprising: a storage capacitor; a switching circuit coupled with the storage capacitator, the switching circuit outputs waveforms with voltages greater than about 1 kV and with a frequencies greater than about 1 kHz; a transformer having a primary side and a secondary side, the switching circuit may be electrically coupled with the primary side of the transformer; and an energy recovery circuit electrically coupled with the secondary side of the transformer (e.g., through an energy recovery diode) and the storage capacitor. In some embodiments, the energy recovery circuit comprises an inductor electrically coupled with the high voltage power supply; and a second diode disposed in series with the inductor and arranged to conduct current from a load to the high voltage power supply.

In some embodiments, the energy recovery circuit comprises a crowbar diode arranged in parallel with the secondary transformer.

In some embodiments, the inductor comprises an inductance of greater than about 50 μH.

In some embodiments, the switching circuit comprises a nanosecond pulser. In some embodiments, the switching circuit comprises an RF driver. In some embodiments, the RF driver comprises either a half-bridge driver, a full-bridge driver, a high frequency solid state switch(es), an RF generator, an amplifier tube based RF generator, or a tube based RF generator.

In some embodiments, the circuit further comprises a bias compensation circuit includes a bias compensation diode in parallel with the bias compensation switch; and a DC power supply arranged in series with the bias compensation diode and the bias compensation switch.

Some embodiments include a method for creating high voltage pulses. The method may comprise: opening a bias compensation switch within a bias compensation circuit while closing the pulser switch, the bias compensation circuit coupled with the secondary of the transformer; closing a pulser switch of a nanosecond pulser to create a pulse, the nanosecond pulser coupled with a primary side of a transformer and a DC power supply, the pulse having a voltage greater than 1 kV on a secondary side of the transformer; opening an energy recovery switch within an energy recovery circuit while closing the pulser switch, the energy recovery circuit coupled with the secondary side of the transformer and the DC power supply; pausing for a period of time less than about 100 nanoseconds; closing the pulser switch of the nanosecond pulser; and opening the energy recovery switch within the energy recovery circuit while closing the pulser switch.

In some embodiments, the energy recovery circuit comprises an inductor and a diode in series with the energy recovery switch.

In some embodiments, the energy recovery switch comprises a plurality of switches arranged in series and having a plurality of voltage sharing resistors such that each voltage sharing resistor of the plurality of voltage sharing resistors is arranged across a corresponding switch of the plurality of switches.

In some embodiments, the bias compensation circuit comprises a bias compensation diode in parallel with the bias compensation switch; and a DC power supply arranged in series with the bias compensation diode and the bias compensation switch.

Some embodiments include a method for creating high voltage pulses. The method may comprise: prior to a burst of pulses, opening a bias compensation switch within a bias compensation circuit coupled with a nanosecond pulser through a transformer, the bias compensation circuit coupled with the secondary of the transformer; during a burst of pulses, repeatedly opening and closing a pulser switch of a nanosecond pulser to create a plurality of pulses within the burst of pulses, the nanosecond pulser coupled with a primary side of the transformer and a DC power supply, the opening and closing of the pulser switch occurring with a pulse repetition frequency greater than about 1 kHz, and the closing of the pulser switch produces pulses with a voltage greater than 1 kV on the secondary side of the transformer; during the burst of pulses, repeatedly closing and opening an energy recovery switch within an energy recovery circuit such that the energy recovery switch is closed when the pulser switch is open and the energy recovery switch is open when the pulser switch is closed, the energy recovery circuit coupled with a secondary side of the transformer and the DC power supply; and after the burst of pulses, closing bias compensation switch within a bias compensation circuit.

In some embodiments, the method may further comprise pausing for period of time less than about 100 microseconds; prior to a second burst of pulses, opening the bias compensation switch; during the second burst of pulses, opening and closing the pulser switch; and during the second burst of pulses, closing opening an energy recovery switch; and after the second burst, closing the bias compensation switch.

In some embodiments, the energy recovery circuit comprises an inductor and a diode in series with the energy recovery switch.

In some embodiments, the energy recovery switch comprises a plurality of switches arranged in series and having a plurality of voltage sharing resistors such that each voltage sharing resistor of the plurality of voltage sharing resistors is arranged across a corresponding switch of the plurality of switches.

In some embodiments, the bias compensation circuit comprises a bias compensation diode in parallel with the bias compensation switch; and a DC power supply arranged in series with the bias compensation diode and the bias compensation switch.

Some embodiments include a nanosecond pulser circuit comprising: a high voltage power supply; a nanosecond pulser electrically coupled with the high voltage power supply and configured to switch voltage from the high voltage power supply at high frequencies; a transformer having a primary side and a secondary side; and an energy recovery circuit arranged in parallel with the primary side of the transformer. In some embodiments, the energy recovery circuit comprises a switch; an inductor; a first diode arranged in series with the switch and the inductor such that the first diode conducts current from the switch, when the switch is closed, to the inductor; and a second diode arranged to conduct current from a point in the nanosecond pulser circuit between the switch, when the switch is closed, and the first diode to a point in the nanosecond pulser circuit between the high voltage power supply and the nanosecond pulser.

Some embodiments include a nanosecond pulser circuit comprising: a high voltage power supply; a nanosecond pulser electrically coupled with the high voltage power supply and configured to switch voltage from the high voltage power supply at high frequencies; a transformer having a primary side and a secondary side, the nanosecond pulser electrically coupled with the primary side of the transformer; and an energy recovery circuit electrically coupled with the second side of the transformer in parallel with the primary side of the transformer. In some embodiments, the energy recovery circuit comprises an inductor electrically coupled with the high voltage power supply; a crowbar diode arranged in parallel with the secondary side of the transformer; and a second diode disposed in series with the inductor and arranged to conduct current from a load to the high voltage power supply.

In some embodiments, the inductor comprises an inductance of less than about 1,000 nH. In some embodiments, the nanosecond pulser switches voltage from the high voltage power supply at frequencies greater than about 100 kHz. In some embodiments, the nanosecond pulser switches voltage from the high voltage power supply at frequencies from about 0 kHz to about 500 kHz. In some embodiments, the nanosecond pulser circuit provides voltage greater than about 5 kV to a load. In some embodiments, the secondary side of the transformer is coupled with a capacitive load. In some embodiments, the secondary side of the transformer is coupled with one or more electrodes that produce or manipulate a plasma. In some embodiments, the energy recovery circuit comprises a switch.

These illustrative embodiments are mentioned not to limit or define the disclosure, but to provide examples to aid understanding thereof. Additional embodiments are discussed in the Detailed Description, and further description is provided there. Advantages offered by one or more of the various embodiments may be further understood by examining this specification or by practicing one or more embodiments presented.

BRIEF DESCRIPTION OF THE FIGURES

These and other features, aspects, and advantages of the present disclosure are better understood when the following Detailed Description is read with reference to the accompanying drawings.

DETAILED DESCRIPTION

Some embodiments include a nanosecond pulser system that provides energy recovery from a load (e.g., a capacitive load) using an energy recovery circuit. In some embodiments, the nanosecond pulser system may include a high voltage, high frequency nanosecond pulser, which may, for example, drive a plasma deposition system, plasma etch system, plasma sputtering system, e-beam system, ion beam system, etc. (the load).

In some embodiments, the energy recovery circuit may recover charge from the load to charge an energy storage capacitor. For example, the energy recover circuit may recover energy that was stored by or charge held by various circuit element including capacitors or inductors. These elements, for example, might include stray or parasitic capacitance or inductances which may normally be dissipated or wasted. The energy recovery circuit, for example, may recover energy by acting to recharge an energy storage capacitor and/or inductor. This energy may be available and/or reutilized by the circuit.

Figure 1:
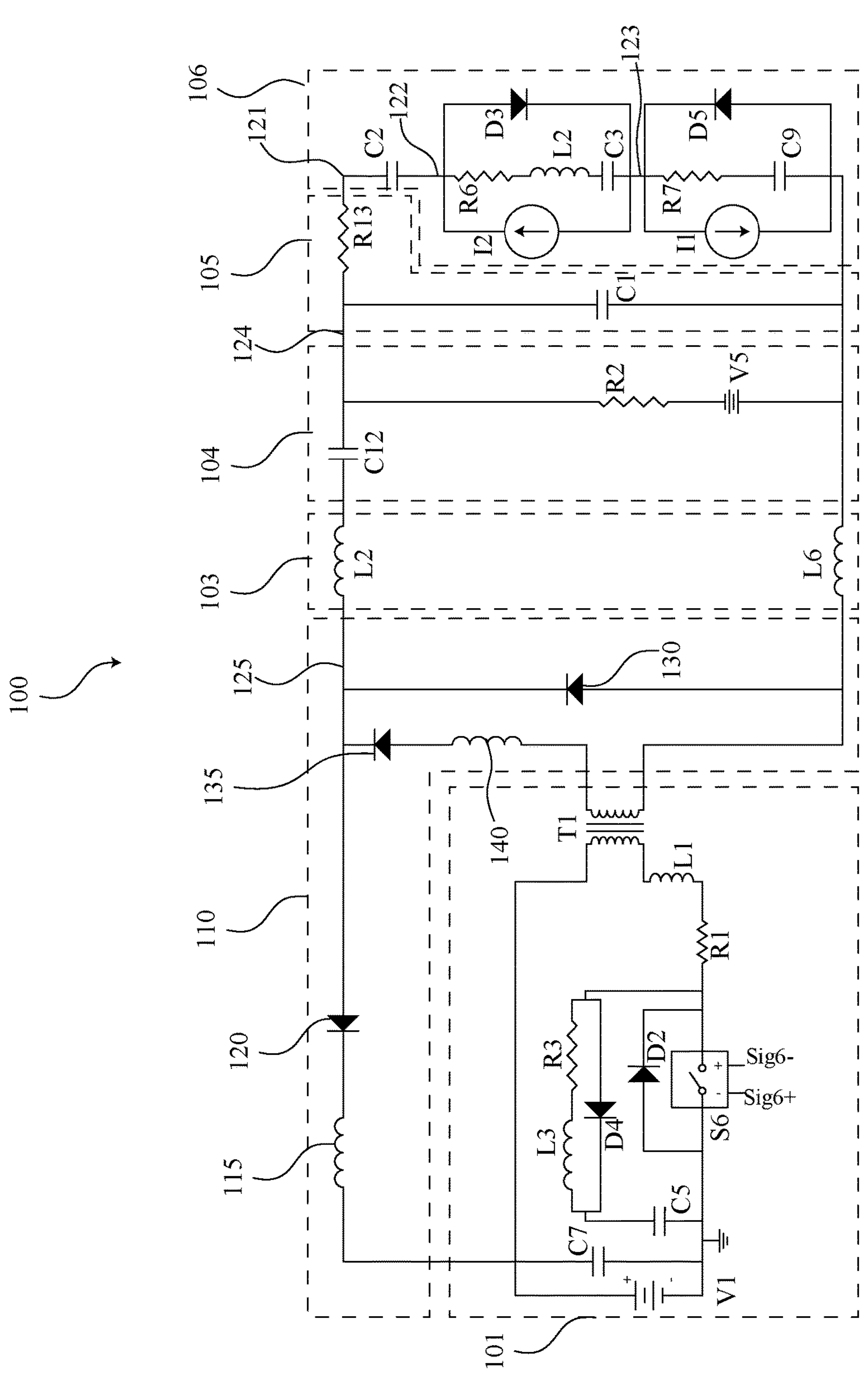
FIG. 1 is a circuit diagram of a nanosecond pulser system with an energy recovery circuit driving a capacitive load according to some embodiments.

FIG. 1 is a circuit diagram of a nanosecond pulser system 100 that includes a nanosecond pulser stage 101 with an energy recovery circuit 110, a transformer T1, a lead stage 103, a DC bias circuit 104, and a load stage 106.

In some embodiments, the load stage 106 may represent an idealized or effective circuit for semiconductor processing chamber such as, for example, a plasma deposition system, semiconductor fabrication system, plasma sputtering system, etc. The capacitance C2, for example, may represent the capacitance of an electrostatic chuck upon which a semiconductor process wafer may sit. The chuck, for example, may comprise a dielectric material (e.g., aluminum oxide, or other ceramic materials and a conductor housed within the dialectic material). For example, the capacitor C1 may have small capacitance (e.g., about 10 pF, 100 pF, 500 pF, 1 nF, 10 nF, 100 nF, etc.).

The capacitor C3, for example, may represent the sheath capacitance between the plasma to the wafer. The resistor R6, for example, may represent the sheath resistance between the plasma and the wafer. The inductor L2, for example, may represent the sheath inductance between the plasma and the wafer. The current source 12, for example, may be represent the ion current through the sheath. For example, the capacitor C1 or the capacitor C3 may have small capacitance (e.g., about 10 pF, 100 pF, 500 pF, 1 nF, 10 nF, 100 nF, etc.).

The capacitor C9, for example, may represent the plasma sheath capacitance to the wall of the chamber. The resistor R7, for example, may represent resistance between the plasma and the chamber wall. The current source 11, for example, may be representative of the ion current in the plasma. For example, the capacitor C1 or the capacitor C9 may have small capacitance (e.g., about 10 pF, 100 pF, 500 pF, 1 nF, 10 nF, 100 nF, etc.).

In some embodiments, the plasma voltage may be the voltage measured from ground to circuit point 123; the wafer voltage is the voltage measured from ground to circuit point 122 and may represent the voltage at the surface of the wafer; the chucking voltage is the voltage measured from ground to circuit point 121; the electrode voltage is the voltage measure from ground to circuit point labeled 124 (e.g., on the electrode); and the input voltage is the voltage measured from ground to circuit point 125.

In this example, the DC bias circuit 104 does not include any bias compensation. The DC bias circuit 104 includes an offset supply voltage V5 that may, for example, bias the output voltage either positively or negatively. In some embodiments, the offset supply voltage V5, can be adjusted to change the potential between the wafer voltage and the chuck voltage. In some embodiments, offset supply voltage V5 can have a voltage of about +5 kV, +4 kV, +3 kV, +2, kV, +1 kV, etc. kV.

In some embodiments, the bias capacitor C12 can isolate (or separate) the DC bias voltage from other circuit elements. The bias capacitor C12, for example, may allow for a potential shift from one portion of the circuit to another. In some embodiments, this potential shift may ensure that the electrostatic force holding the wafer in place on the chuck remains below the voltage threshold. The resistor R2 may isolate the DC bias supply from the high voltage pulsed output from the nanosecond pulser stage 101.

The bias capacitor C12, for example, may have a capacitance less than about 100 pF, 10 pF, 1 pF, 100 μF, 10 μF, 1 μF, etc. The resistor R2, for example, may have a high resistance such as, for example, a resistance of about 1 kOhm, 10 kOhm, 100 kOhm, 1 MOhm, 10 MOhm, 100 MOhm, etc.

The resistor R13, for example, may represent the resistance of the leads or transmission lines that connect from the output of the high voltage power system to the electrode (e.g., the load stage 106). The capacitors C1, for example, may represent stray capacitance in the leads or transmissions line.

In some embodiments, the nanosecond pulser stage 101 may produce pulses with high pulse voltage (e.g., voltages greater than 1 kV, 10 kV, 20 kV, 50 kV, 100 kV, etc.), high frequencies (e.g., frequencies greater than 1 kHz, 10 kHz, 100 kHz, 200 kHz, 500 kHz, 1 MHZ, etc.), fast rise times (e.g., rise times less than about 1 ns, 10 ns, 50 ns, 100 ns, 250 ns, 500 ns, 1,000 ns, etc.), fast fall times (e.g., fall times less than about 1 ns, 10 ns, 50 ns, 100 ns, 250 ns, 500 ns, 1,000 ns, etc.) and/or short pulse widths (e.g., pulse widths less than about 1,000 ns, 500 ns, 250 ns, 100 ns, 20 ns, etc.).

For example, the nanosecond pulser stage 101 may include all or any portion of any device described in U.S. patent application Ser. No. 14/542,487, titled "High Voltage Nanosecond Pulser," which is incorporated into this disclosure for all purposes, or all or any portion of any device described in U.S. patent application Ser. No. 14/635,991, titled "Galvanically Isolated Output Variable Pulse Generator Disclosure," which is incorporated into this disclosure for all purposes, or all or any portion of any device described in U.S. patent application Ser. No. 14/798,154, titled "High Voltage Nanosecond Pulser With Variable Pulse Width and Pulse Repetition Frequency," which is incorporated into this disclosure for all purposes.

In some embodiments, the nanosecond pulser stage 101 may include one or more nanosecond pulsers coupled together in any number of ways.

In some embodiments, the nanosecond pulser stage 101 may include a DC power supply providing a consistent DC voltage that is switched by switch S6 and provides the switched power to the transformer T1. The DC power supply may include a voltage source V5 and an energy storage capacitor C7. If the transformer T1 has a 1:10 turn ratio, then the transformer may produce 10 kV on the load C1.

In some embodiments, if the load capacitance (e.g., capacitance C3 and capacitance C9) is small in comparison with the capacitance of the energy storage capacitor C7, voltage doubling may (or may not) occur at the transformer input. For example, if the energy storage capacitor C7 provides 500 V, then 1 kV may be measured at the input of the transformer T1.

The switch S6, for example, may include one or more solid state switches such as, for example, an IGBT, a MOSFET, a SiC MOSFET, SiC junction transistor, FETs, SiC switches, GaN switches, photoconductive switch, etc. The switch S6 may be switched based on a signal from a controller labeled Sig6+ and Sig6−.

In some embodiments, the nanosecond pulser stage 101 may include snubber circuit that may include any type of snubber circuit. In some embodiments, the snubber circuit may include a capacitor. In some embodiments, the snubber circuit may include a capacitor and a resistor. In some embodiments, the snubber circuit may include a capacitor, an inductor, and a resistor In some embodiments, the snubber circuit may include snubber resistor R3 in parallel with snubber diode D4, and a snubber capacitor C5. The snubber circuit may also include stray inductance. In some embodiments, the snubber resistor R3 and/or the snubber diode D4 may be placed between the collector of switch S6 and the primary winding of the transformer T1. The snubber diode D4 may be used to snub out any over voltages in the switching. A large and/or fast capacitor C5 may be coupled on the emitter side of the switch S6. The freewheeling diode D2 may also be coupled with the emitter side of the switch S1. Various other components may be included that are not shown in the figures. One or more switches and or circuits can be arranged in parallel or series.

In some embodiments, the switch S6 may switch so fast that the switched voltage may never be at full voltage (e.g., the voltage of the energy storage capacitor C7 and/or the voltage source V5). In some embodiments, a gate resistor coupled with the switch S6 may be set with short turn on pulses.

In some embodiments, the nanosecond pulser stage 101 may include a freewheeling diode D2. In some embodiments, the freewheeling diode D2 may be used in combination with inductive loads to ensure that energy stored in the inductive load may be allowed to dissipate after the switch S6 is opened by allowing current to keep flowing in the same direction through the inductor and energy is dissipated in the resistive elements of the circuit. If a freewheeling diode D2 is not included, then this can, for example, lead to a large reverse voltage on the switch S6.

In some embodiments, the nanosecond pulser stage 101 may include stray inductance L1 and/or stray resistance R1. The stray inductance L1, for example, may be less than about 10 nH, 100 nH, 1,000 nH, 10,000 nH, etc. The stray resistance R1, for example, may be less than about 1 Ohm, 100 mOhm, 10 mOhm, etc.

In some embodiments, the energy recovery circuit 110 may be electrically coupled with the secondary side of the transformer and/or with the energy storage capacitor C7. The energy recovery circuit 110, for example, may include a diode 130 (e.g., a crowbar diode) across the secondary side of the transformer T1. The energy recovery circuit 110, for example, may include energy recovery diode 120 and the energy recovery inductor 115 (arranged in series), which can allow current to flow from the secondary side of the transformer T1 to charge the energy storage capacitor C7. The energy recovery diode 120 and the energy recovery inductor 115 may be electrically connected with the secondary side of the transformer T1 and the energy storage capacitor C7. In some embodiments, the energy recovery circuit 110 may include diode 130 and/or inductor 140 electrically coupled with the secondary of the transformer T1. The inductor 140 may represent the stray inductance and/or may include the stray inductance of the transformer T1.

In some embodiments, the energy recovery inductor 115 may include any type of inductor such as, for example, a ferrite core inductor or an air core inductor. In some embodiments, the energy recovery inductor 115 may have any type of geometry such as, for example, a solenoidal winding, a toroidal winding, etc. In some embodiments, the energy recovery inductor 115 may have an inductance greater then about 10 μH, 50 pH, 100 μH, 500 μH, etc. In some embodiments, the energy recovery inductor 115 may have an inductance of about 1 μH to about 100 mH.

In some embodiments, when the nanosecond pulser is turned on, current may charge the load stage 106 (e.g., charge the capacitor C3, capacitor C2, or capacitor C9). Some current, for example, may flow through energy recovery inductor 115 when the voltage on the secondary side of the transformer T1 rises above the charge voltage on the energy storage capacitor C7. When the nanosecond pulser is turned off, current may flow from the capacitors within the load stage 106 (e.g., capacitor C1) through the energy recovery inductor 115 to charge the energy storage capacitor C7 until the voltage across the energy recovery inductor 115 is zero. The diode 130 may prevent the capacitors within the load stage 106 from ringing with the inductance in the load stage 106 or the DC bias circuit 104.

The energy recovery diode 120 may, for example, prevent charge from flowing from the energy storage capacitor C7 to the capacitors within the load stage 106.

The value of energy recovery inductor 115 can be selected to control the current fall time. In some embodiments, the energy recovery inductor 115 can have an inductance value between 1 μH-600 μH. In some embodiments, the energy recovery inductor 115 can have an inductance value greater than 50 ρH. In some embodiments, the energy recovery inductor 115 may have an inductance less than about 50 μH, 100 pH, 150 μH, 200 μH, 250 H, 300 μH, 350 μH, 350 pH, 400 pH, 400 μH, 500 μH, etc.

For example, if the energy storage capacitor C7 provides 500 V, then 1 kV will be measured at the input of the transformer T1 (e.g., as noted above due to voltage doubling). The 1 kV at the transformer T1 may be divided among the components of the energy recovery circuit 110 when the switch S6 is open. If the values are chosen appropriately (e.g., inductor L3 has an inductance less than the inductance of energy recovery inductor 115), the voltage across the energy recovery diode 120 and the energy recovery inductor 115 may be greater than 500 V. Current may then flow through energy recovery diode 120 and/or charge the energy storage capacitor C7. Current may also flow through diode D3 and inductor L6. Once the energy storage capacitor C7 is charged, the current may no longer flow through diode D3 and energy recovery inductor 115.

In some embodiments, the energy recovery circuit 110 may transfer energy (or transfer charge) from the load stage 106, for example, on fast time scales (e.g., 1 ns, 10 ns, 50 ns, 100 ns, 250 ns, 500 ns, 1,000 ns, etc. time scales). The stray resistance of the energy recovery circuit may be low to ensure the pulse across the load stage 106 has a fast fall time $t_f$. The stray resistance of the energy recovery circuit 110, for example, may have a resistance less than about 1 Ohm, 100 mOhm, 10 mOhm, etc. In some embodiments, the energy transfer efficiency from the load stage 106 may be high such as, for example, greater than about 60%, 70%, 80%, or 90%, etc.

Any number of components shown in FIG. 1 may or may not be required such as, for example, the diode 135 or the diode 130 or the inductor 140.

In some embodiments, a diode may be placed between the voltage source V1 and the point where the energy recovery circuit 110 connects with the voltage source V1 and/or the energy storage capacitor C7. This diode, for example, may be arranged to allow current to flow from the voltage source V1 to the energy storage capacitor C7 but may not allow current to flow from the energy recovery circuit to the energy storage capacitor C7.

Figure 2:
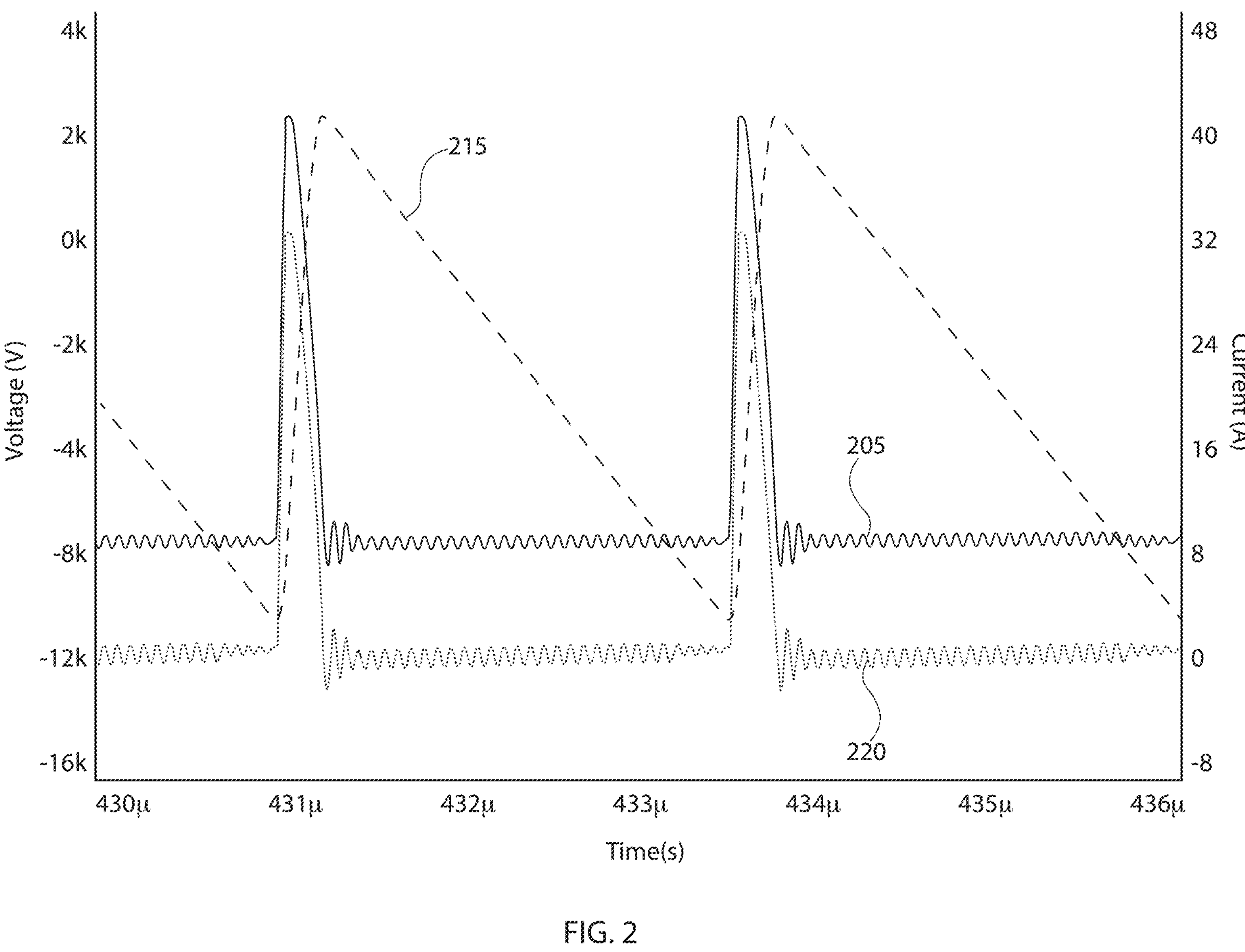
FIG. 2 illustrates waveforms of the voltage and current within the circuit diagram shown in FIG. 1.

FIG. 2 illustrates waveforms of the voltage and current within the nanosecond pulser system 100 shown in FIG. 1. The waveform 205 represents the voltage into the load stage 106 measured at the point labeled 124 (e.g., on the electrode) in the nanosecond pulser system 100. The waveform 220 represents the voltage at the point labeled 122 (e.g., on the wafer). The waveform 215 represents the current through the energy recovery inductor 115. The waveform 215 shows that the current through the energy recovery inductor 115 when the nanosecond pulser stage 101 is turned on (e.g., as shown by the light blue waveform rising). When the nanosecond pulser stage 101 is turned off, the current through the energy recovery inductor 115 continues to rise to a maximum prior to falling. The current should stop flowing through the energy recovery inductor 115 when the voltage across the energy recovery inductor 115 goes to zero; however, in this example, the nanosecond pulser stage 101 is turned on again before the voltage across the energy recovery inductor 115 goes to zero.

In some embodiments, the potential at the point labeled 121 in FIG. 1 is shown as negative, however, the chucking potential could also be positive.

Figure 3:
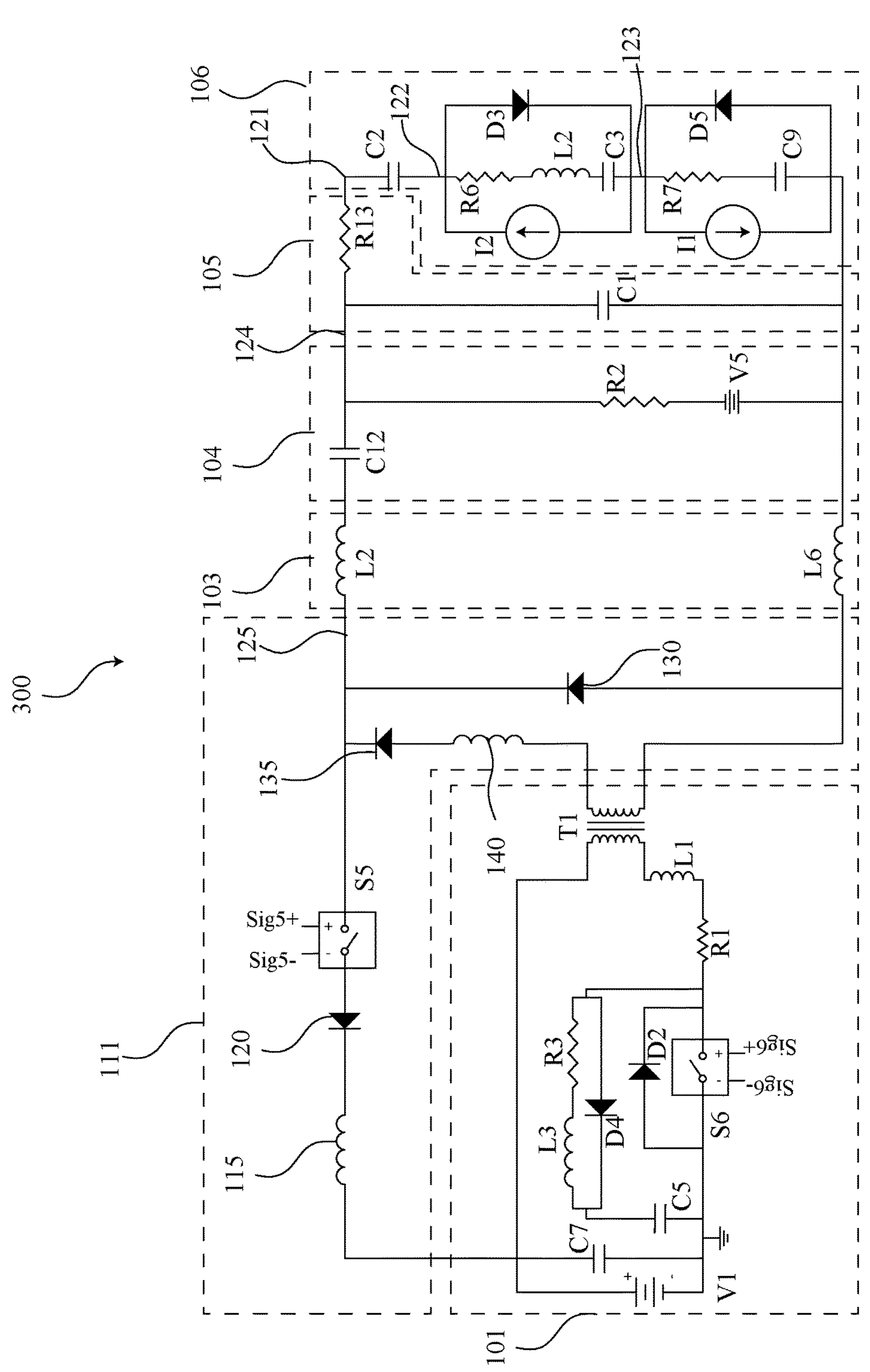
FIG. 3 is a circuit diagram of a nanosecond pulser system that includes a nanosecond pulser with an energy recovery circuit having an energy recover switch according to some embodiments.

FIG. 3 is a circuit diagram of a nanosecond pulser system 300 that includes a nanosecond pulser stage 101 with an active energy recovery circuit 111 having an energy recover switch S5 according to some embodiments. The energy recovery switch S5 may be switched based on a signal from a controller labeled Sig5+ and Sig5−.

In FIG. 3, the active energy recovery circuit 111 may include an energy recovery switch S5 that can be used to control the flow of current through the energy recovery inductor 115. In some embodiments, the energy recovery switch S5 may include a freewheeling diode arranged across the energy recovery switch. The energy recovery switch S5, for example, may be placed in series with the energy recovery inductor 115. In some embodiments, the energy recovery switch S5 may be opened and closed based on a signal from Sig5+ and/or Sig5−. In some embodiments, the switching input V5 may close the energy recovery switch when the switch S1 is open and/or no longer pulsing to allow current to flow from the load stage 106 back to the high voltage load C7. In some embodiments, the switching signal from Sig5+ and/or Sig5− may open the energy recovery switch when the switch S1 is closed and/or pulsing to restrict current from flowing to the high voltage load C7.

The energy recovery switch S5 in FIG. 3 is shown in series with the energy recovery diode 120 and the energy recovery inductor 115 and is placed between the secondary side of the transformer T1 and both the energy recovery diode 120 and the energy recovery inductor 115. In some embodiments, both the energy recovery diode 120 and the energy recovery inductor 115 may be placed between the energy recovery switch S5 and the secondary side of the transformer T1. In some embodiments, the energy recovery switch S5 may be placed between the energy recovery diode 120 and the energy recovery inductor 115. The energy recovery diode 120, the energy recovery inductor 115, and the energy recovery switch S5 may be arranged in any order.

The energy recovery switch S5, for example, may include a high voltage switch such as, for example, the high voltage switch 1400.

In some embodiments, the load stage 106 may be charged by the nanosecond pulser stage 101 while the energy recovery switch S5 is open. It may be beneficial to remove the charge from the load stage 106 such as, for example, on fast time scales (e.g., less than about 1 ns, 10 ns, 50 ns, 100 ns, 250 ns, 500 ns, 1,000 ns, etc.). To remove the charge from the load stage 106, the energy recovery switch S5 may be closed.

Figure 4:
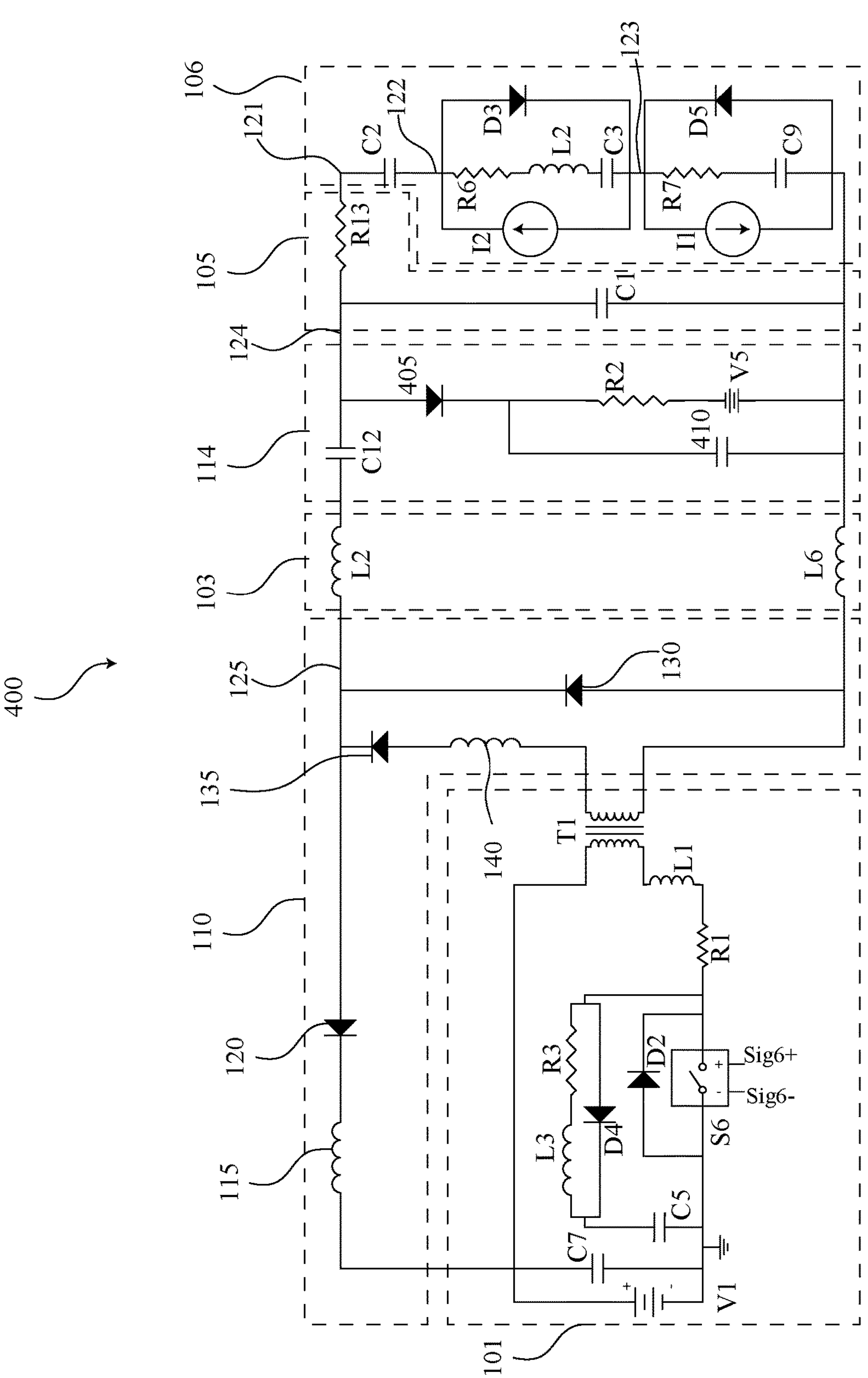
FIG. 4 is a circuit diagram of a nanosecond pulser system that includes a passive bias compensation circuit with the energy recovery circuit according to some embodiments.

FIG. 4 is a circuit diagram of a nanosecond pulser system 400 that includes a passive bias compensation circuit 114 with the energy recovery circuit 110 according to some embodiments.

In this example, the passive bias compensation circuit 114 is a passive bias compensation circuit and can include a bias compensation diode 405 and a bias compensation capacitor 410. The bias compensation diode 405 can be arranged in series with offset supply voltage V5. The bias compensation capacitor 410 can be arranged across either or both the offset supply voltage V5 and the resistor R2. The bias compensation capacitor 410 can have a capacitance less than 100 nF to 100 μF such as, for example, about 100 μF, 50 μF, 25 μF, 10 μF, 2 μF, 500 nF, 200 nF, etc.

In some embodiments, the bias compensation diode 405 can conduct currents of between 10 A and 1 kA at a frequency of between 10 Hz and 500 kHz.

In some embodiments, the bias capacitor C12 may allow for a voltage offset between the output of the nanosecond pulser stage 101 (e.g., at the position labeled 125) and the voltage on the electrode (e.g., at the position labeled 124). In operation, the electrode may, for example, be at a DC voltage of 2 kV during a burst (a burst may include a plurality of pulses), while the output of the nanosecond pulser alternates between +6 kV during pulses and 0 kV between pulses.

The bias capacitor C12, for example, 100 nF, 10 nF, 1 nF, 100 μF, 10 μF, 1 μF, etc. The resistor R2, for example, may have a high resistance such as, for example, a resistance of about 1 kOhm, 10 kOhm, 100 kOhm, 1 MOhm, 10 MOhm, 100 MOhm, etc.

In some embodiments, the bias compensation capacitor 410 and the bias compensation diode 405 may allow for the voltage offset between the output of the nanosecond pulser stage 101 (e.g., at the position labeled 125) and the voltage on the electrode (e.g., at the position labeled 124) to be established at the beginning of each burst, reaching the needed equilibrium state. For example, charge is transferred from capacitor C12 into bias compensation capacitor 410 at the beginning of each burst, over the course of a plurality of pulses (e.g., maybe about 5-100 pulses), establishing the correct voltages in the circuit.

In some embodiments, the pulse repetition frequency (e.g., the frequency of pulses within a burst) may be between 200 kHz and 800 MHz such as, for example, 2 MHz, 13.56 MHZ, 27 MHz, 60 MHz, and 80 MHz etc. In some embodiments, the burst repetition frequency (e.g., the frequency of bursts) may be about 10 kHz, 50 Hz, 100 kHz, 500 kHz, 1 MHz, etc. such as, for example, 400 kHz The energy recovery circuit 110 may or may not include an energy recovery switch as shown in FIG. 3.

Figure 5:
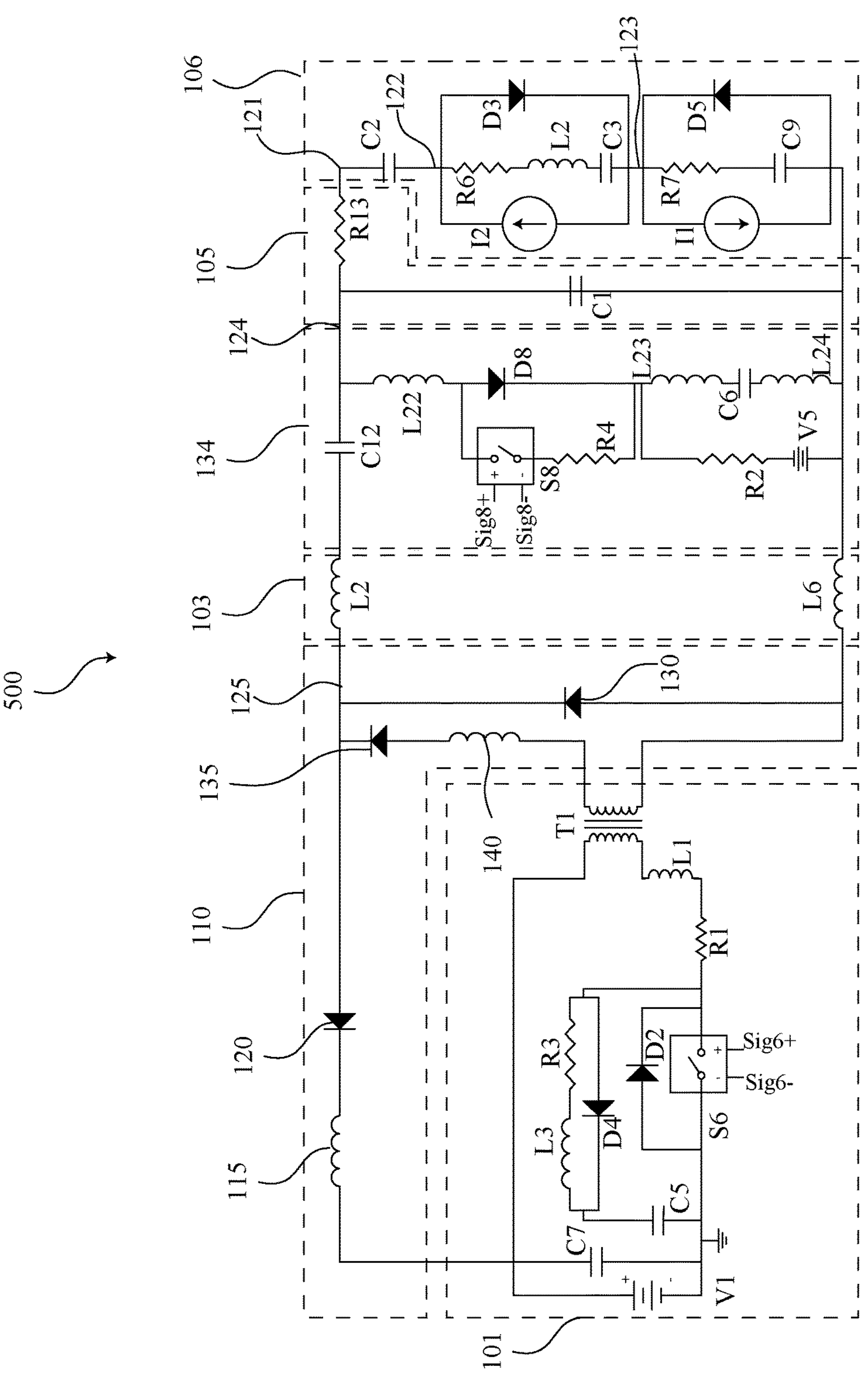
FIG. 5 is a circuit diagram of a nanosecond pulser system that includes an active bias compensation circuit with the energy recovery circuit according to some embodiments.

FIG. 5 is a circuit diagram of a nanosecond pulser system 500 that includes an active bias compensation circuit 134 with the energy recovery circuit 110 according to some embodiments.

The active bias compensation circuit 134 may include any bias and/or bias compensation circuit known in the art. For example, the active bias compensation circuit 134 may include any bias and/or bias compensation circuit described in U.S. patent application Ser. No. 16/523,840 titled "NANOSECOND PULSER BIAS COMPENSATION," which is incorporated into this disclosure in its entirety for all purposes.

In some embodiments, the active bias compensation circuit 134 of nanosecond pulser system 500 shown in FIG. 5 may include a bias capacitor C6, blocking capacitor C12, a blocking diode D8, bias compensation bias compensation switch S8 (e.g., a high voltage switch), an offset supply voltage V5, resistance R2, and/or resistance R4. In some embodiments, the switch S8, for example, may include a high voltage switch such as, for example, the high voltage switch 1400 shown in FIG. 14. The bias compensation switch S8 may be switched based on a signal from a controller labeled Sig8+ and Sig8−.

In some embodiments, the offset supply voltage V5 may include a DC voltage source that can bias the output voltage either positively or negatively. In some embodiments, the capacitor C12 may isolate/separate the offset supply voltage V5 from other circuit elements. In some embodiments, the active bias compensation circuit 134 may allow for a potential shift of power from one portion of the circuit to another. In some embodiments, the active bias compensation circuit 134 may be used maintain a constant chucking force between a process wafer and an electrostatic chuck. Resistance R2, for example, may protect/isolate the DC bias supply from the driver. As another example, the resistance R2 may be used to ensure that the DC supply V5 does not go into overcurrent failure.

In some embodiments, the bias compensation switch S8 may be open while the nanosecond pulser stage 101 is not actively producing pulses at greater than 10 kHz or providing a burst of pulses and closed when the nanosecond pulser stage 101 is not pulsing. While closed, the bias compensation switch S8 may, for example, allow current in the direction prevented by the blocking diode D8. Shorting this current may allow the bias between the wafer and the chuck to be less than 2 kV, which may be within acceptable tolerances.

In some embodiments, the load stage 106 may be coupled with the active bias compensation circuit 134. In some embodiments, the energy recovery circuit 110 may or may not include an energy recovery switch as shown in FIG. 3.

Figure 6:
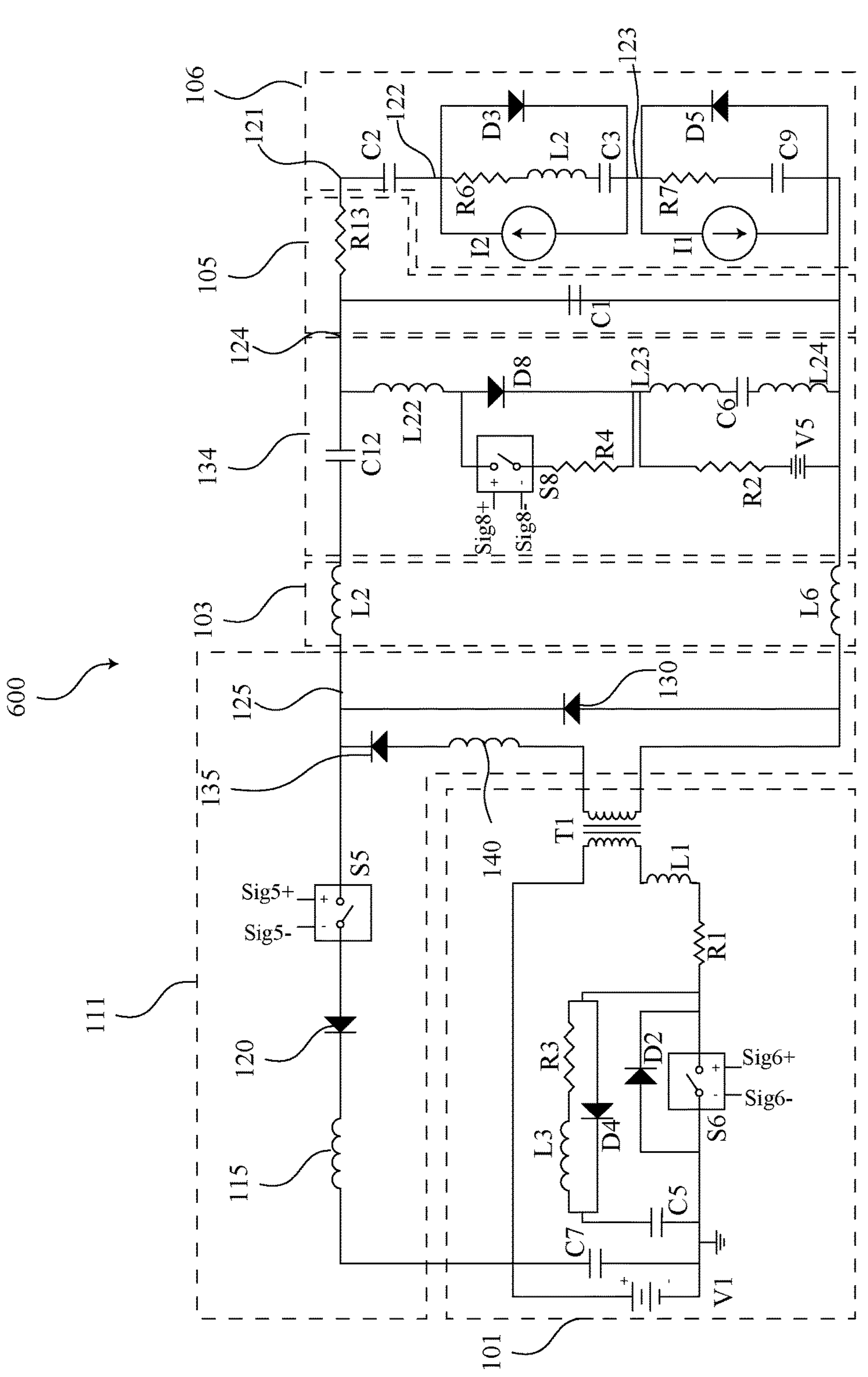
FIG. 6 is a circuit diagram of a nanosecond pulser system that includes an active bias compensation circuit with an energy recovery circuit according to some embodiments.

FIG. 6 is a circuit diagram of a nanosecond pulser system 600 that includes an active bias compensation circuit 134 with an active energy recovery circuit 111 according to some embodiments.

Figure 7:
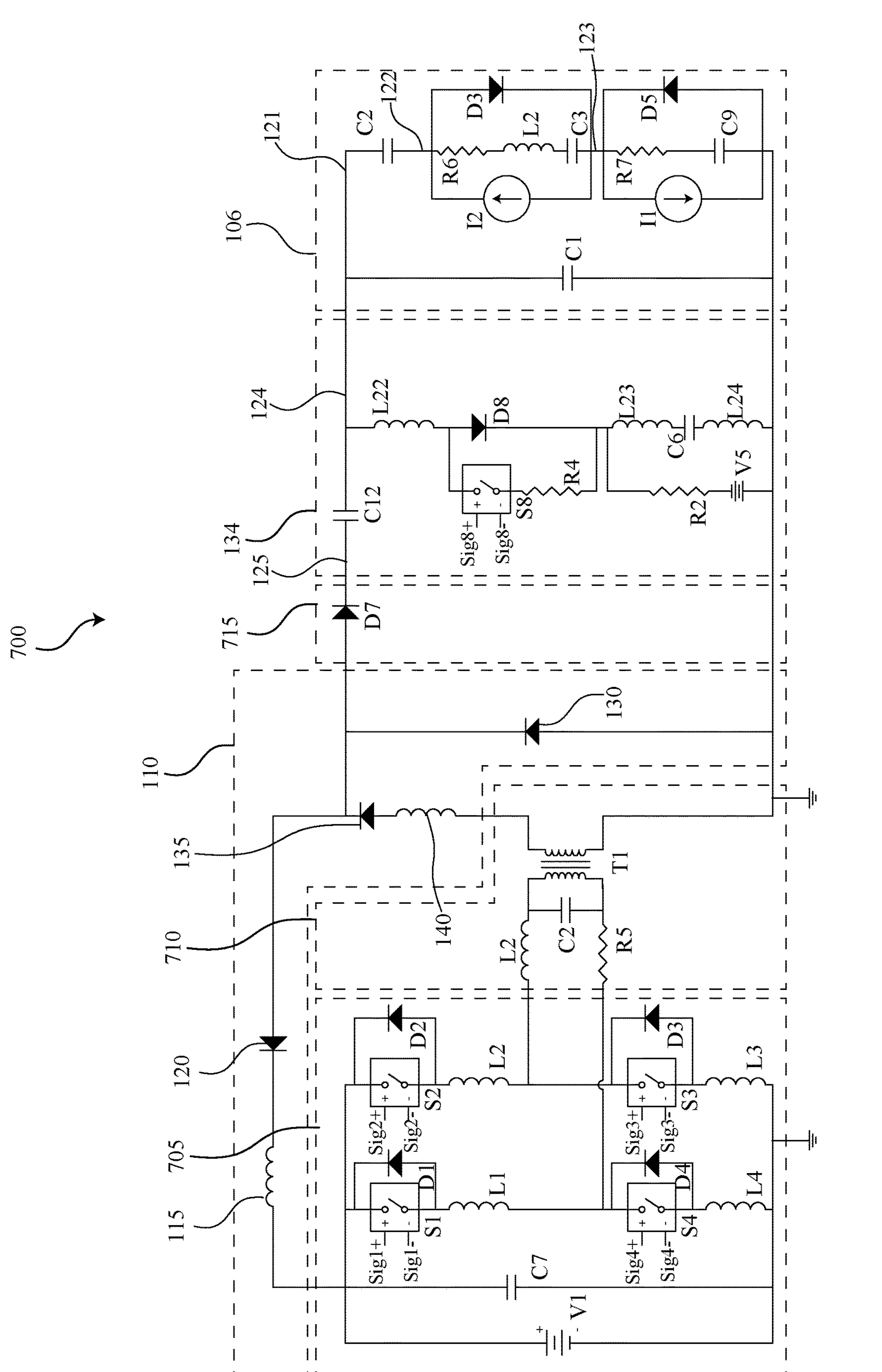
FIG. 7 is a circuit diagram of an RF driver system that includes an RF driver, the active bias compensation circuit, and the energy recovery circuit according to some embodiments.

FIG. 7 is a circuit diagram of a matchless RF driver system 700 that includes an RF driver 705, the active bias compensation circuit 134, and the energy recovery circuit 110 according to some embodiments.

In this example, the matchless driver system 700 may include an RF driver 705 rather than a nanosecond pulser stage 101. The RF driver 705, for example, may be a half-bridge driver or a full-bridge driver. The RF driver 705 may include a voltage source V1 that may be a DC voltage source (e.g., a capacitive source, AC-DC converter, etc.). In some embodiments, the RF driver 705 may include four switches S1, S2, S3, and S4. In some embodiments, the RF driver 705 may include a plurality of switches S1, S2, S3, and S4 in series or in parallel. These switches S1, S2, S3, and S4, for example, may include any type of solid-state switch such as, for example, IGBTs, a MOSFETs, a SiC MOSFETs, SiC junction transistors, FETs, SiC switches, GaN switches, photoconductive switches, etc. These switches S1, S2, S3, and S4 may be switched at high frequencies and/or may produce a high voltage pulses. These frequencies may, for example, include frequencies of about 400 kHz, 0.5 MHz, 2.0 MHz, 4.0 MHz, 13.56 MHz, 27.12 MHz, 40.68 MHz, 50 MHz, etc.

Each switch of switches S1, S2, S3, and S4 may be coupled in parallel with a respective diode D1, D2, D3, and D4 and may include stray inductance represented by inductor L1, L2, L3, and LA. In some embodiments, the inductances of inductor L1, L2, L3, and L4 may be equal. In some embodiments, the inductances of inductor L1, L2, L3, and LA may be less than about 50 nH, 100 nH, 150 nH, 500 nH, 1,000 nH, etc. The combination of a switch (S1, S2, S3, or S4) and a respective diode (D1, D2, D3, or D4) may be coupled in series with a respective inductor (L1, L2, L3, or LA). Inductors L3 and LA are connected with ground. Inductor L1 is connected with switch S4 and the resonant circuit 710. And inductor L2 is connected with switch S3 and the opposite side of the resonant circuit 710.

Figure 14:
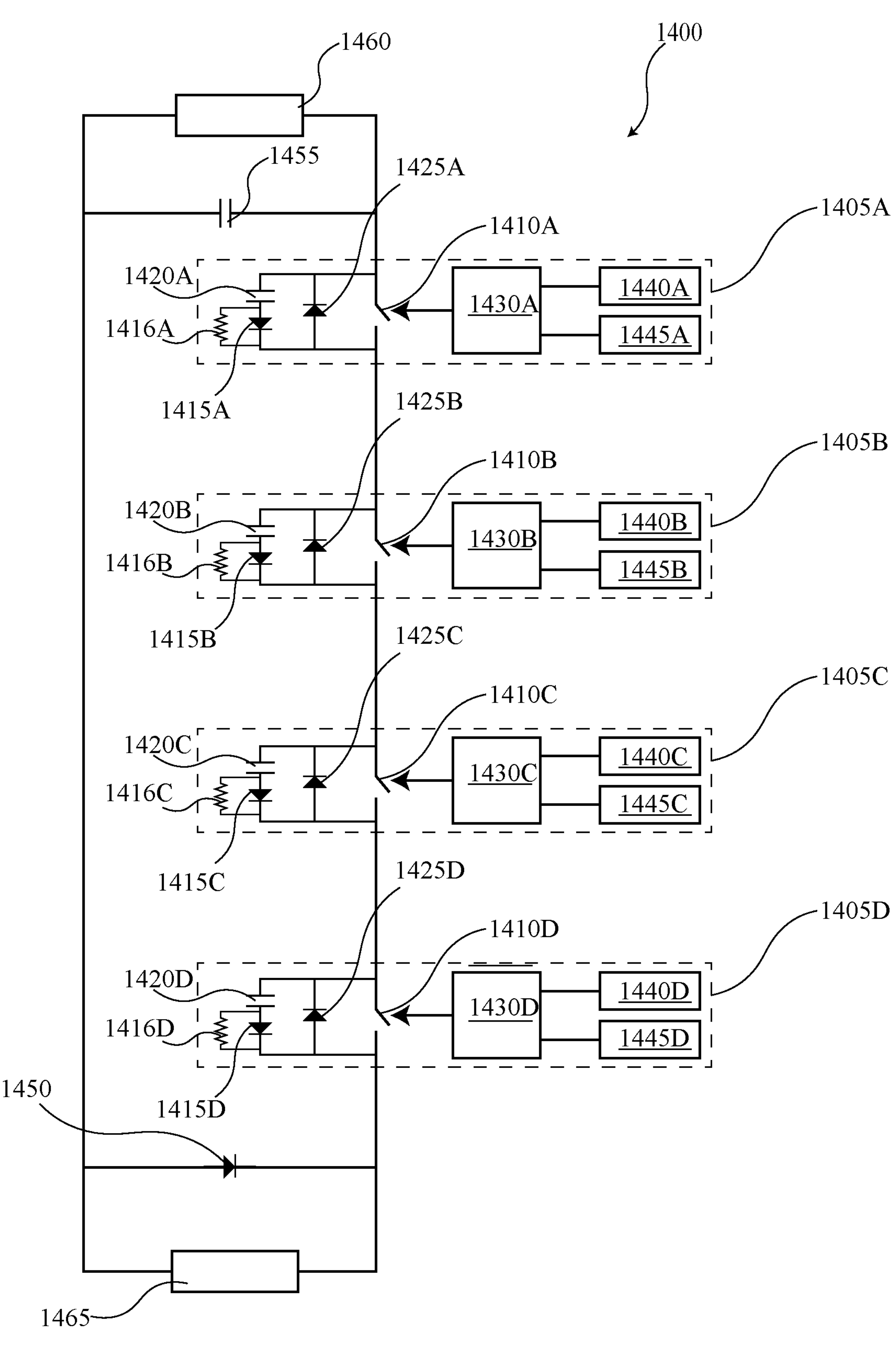
FIG. 14 is a block diagram of a high voltage switch with isolated power according to some embodiments.

The switches S1, S2, S3, and S4 may include a high voltage switch such as, for example, the high voltage switch 1400 shown in FIG. 14.

In some embodiments, the RF driver 705 may be coupled with a resonant circuit 710. The resonant circuit 710 may include a resonant inductor L5 and/or a resonant capacitor C2 coupled with a transformer T1. The resonant circuit 710 may include a resonant resistance R5, for example, that may include the stray resistance of any leads between the RF driver 705 and the resonant circuit 710 and/or any component within the resonant circuit 710 such as, for example, the transformer T1, the capacitor C2, and/or the inductor L5. In some embodiments, the resonant resistance R5 comprises only stray resistances of wires, traces, or circuit elements. While the inductance and/or capacitance of other circuit elements may affect the driving frequency, the driving frequency can be set largely by choice of the resonant inductor L5 and/or the resonant capacitor C2. Further refinements and/or tuning may be required to create the proper driving frequency in light of stray inductance or stray capacitance. In addition, the rise time across the transformer T1 can be adjusted by changing L5 and/or C2, provided that:

$$f_{resonant} = \frac{1}{2\pi\sqrt{(L5)(C2)}} = \text{constant.}$$

Figure 17:
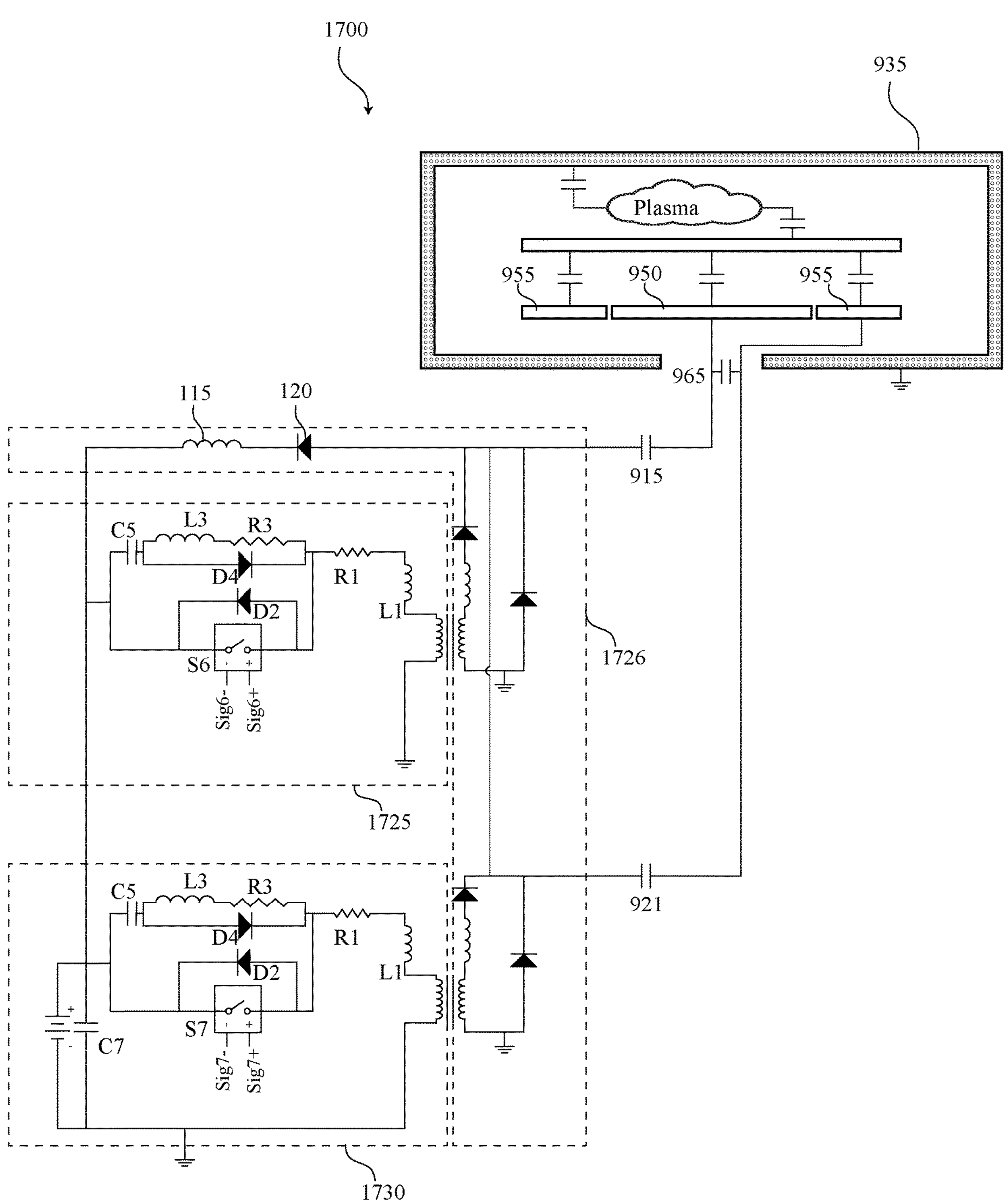
FIG. 17 is a schematic of a spatially variable wafer bias system according to some embodiments.

In some embodiments, large inductance values for L5 can result in slower or shorter rise times. These values may also affect the burst envelope. As shown in FIG. 17, each burst can include transient and steady state pulses. The transient pulses within each burst may be set by L5 and/or the Q of the system until full voltage is reached during the steady state pulses.

If the switches in the RF driver 705 are switched at the resonant frequency, $f_{resonant}$, then the output voltage at the transformer T1 will be amplified. In some embodiments, the resonant frequency may be about 400 kHz, 0.5 MHz, 2.0 MHz, 4.0 MHz, 13.56 MHz, 27.12 MHz, 40.68 MHz, 50 MHz, etc.

In some embodiments, the resonant capacitor C2 may include the stray capacitance of the transformer T1 and/or a physical capacitor. In some embodiments, the resonant capacitor C2 may have a capacitance of about 10 μF, 1 μF, 100 nF, 10 nF, etc. In some embodiments, the resonant inductor L5 may include the stray inductance of the transformer T1 and/or a physical inductor. In some embodiments, the resonant inductor L5 may have an inductance of about 50 nH, 100 nH, 150 nH, 500 nH, 1,000 nH, etc. In some embodiments, the resonant resistor R5 may have a resistance of about 10 ohms, 25 ohms, 50 ohms, 100 ohms, 150 ohms, 500 ohms, etc.

In some embodiments, the resonant resistor R5 may represent the stray resistance of wires, traces, and/or the transformer windings within the physical circuit. In some embodiments, the resonant resistor R5 may have a resistance of about 10 mohms, 50 mohms, 100 mohms, 200 mohms, 500 mohms, etc.

In some embodiments, the transformer T1 may comprise a transformer as disclosed in U.S. patent application Ser. No. 15/365,094, titled "High Voltage Transformer," which is incorporated into this document for all purposes. In some embodiments, the output voltage of the resonant circuit 710 can be changed by changing the duty cycle (e.g., the switch "on" time or the time a switch is conducting) of switches S1, S2, S3, and/or S4. For example, the longer the duty cycle, the higher the output voltage; and the shorter the duty cycle, the lower the output voltage. In some embodiments, the output voltage of the resonant circuit 710 can be changed or tuned by adjusting the duty cycle of the switching in the RF driver 705.

For example, the duty cycle of the switches can be adjusted by changing the duty cycle of signal Sig1, which opens and closes switch S1; changing the duty cycle of signal Sig2, which opens and closes switch S6; changing the duty cycle of signal Sig3, which opens and closes switch S3; and changing the duty cycle of signal Sig4, which opens and closes switch S4. By adjusting the duty cycle of the switches S1, S2, S3, or S4, for example, the output voltage of the resonant circuit 710 can be controlled.

In some embodiments, each switch S1, S2, S3, or S4 in the resonant circuit 710 can be switched independently or in conjunction with one or more of the other switches. For example, the signal Sig1 may be the same signal as signal Sig3. As another example, the signal Sig2 may be the same signal as signal Sig4. As another example, each signal may be independent and may control each switch S1, S2, S3, or S4 independently or separately.

In some embodiments, the resonant circuit 710 may be coupled with a half-wave rectifier 715 that may include a blocking diode D7.

The active bias compensation circuit 134 may include the active bias compensation circuit described in conjunction with FIG. 5.

The matchless driver system 700 does not include a traditional matching network such as, for example, a 50 ohm matching network or an external matching network or standalone matching network. In some embodiments, the matchless driver system 700 does not require a 50 ohm matching network to tune the switching power applied to the wafer chamber. In some embodiments the matchless driver system 700 may include a variable output impedance RF generator without a traditional matching network. This can allow for rapid changes to the power drawn by the plasma chamber. Typically, this tuning of the matching network can take at least 100 μs-200 μs. In some embodiments, power changes can occur within one or two RF cycles, for example, 2.5 μs-5.0 μs at 400 kHz.

In this example, the energy recovery circuit 110 may be positioned on or electrically coupled with the secondary side of the transformer T1. The energy recovery circuit 110, for example, may include a diode 130 (e.g., a crowbar diode) across the secondary side of the transformer T1. The energy recovery circuit 110, for example, may include energy recovery diode 120 and the energy recovery inductor 115 (arranged in series), which can allow current to flow from the secondary side of the transformer T1 to charge the energy storage capacitor C7 and current to flow to the load stage 106. The energy recovery diode 120 and the energy recovery inductor 115 may be electrically connected with the secondary side of the transformer T1 and coupled with the energy storage capacitor C7. In some embodiments, the energy recovery circuit 110 may include diode 130 and/or inductor 140 electrically coupled with the secondary of the transformer T1. The energy recovery inductor 115 may represent the stray inductance and/or may include the stray inductance of the transformer T1.

When the nanosecond pulser is turned on, current may charge capacitors in the load stage 106 (e.g., charge the capacitor C3, capacitor C2, or capacitor C9). Some current, for example, may flow through energy recovery inductor 115 when the voltage on the secondary side of the transformer T1 rises above the charge voltage on the energy storage capacitor C7. When the nanosecond pulser is turned off, current may flow from the capacitors within the load stage 106 (e.g., capacitor C1) through the energy recovery inductor 115 to charge the energy storage capacitor C7 until the voltage across the energy recovery inductor 115 is zero. The diode 130 may prevent the capacitors within the load stage 106 from ringing with the inductance in the load stage 106 or the active bias compensation circuit 134.

The energy recovery diode 120 may, for example, prevent charge from flowing from the energy storage capacitor C7 to the capacitors within the load stage 106.

The value of energy recovery inductor 115 can be selected to control the current fall time. In some embodiments, the energy recovery inductor 115 can have an inductance value between 1 μH-500 μH.

In some embodiments, the energy recovery circuit 110 may include a switch that can be used to control the flow of current through the energy recovery inductor 115. The switch, for example, may be placed in series with the energy recovery inductor 115. In some embodiments, the switch may be closed when the switch S1 is open and/or no longer pulsing to allow current to flow from the load stage 106 back to the energy storage capacitor C7.

A switch in the energy recovery circuit 110, for example, may include a high voltage switch such as, for example, the high voltage switch 1400 shown in FIG. 14.

Figure 8:
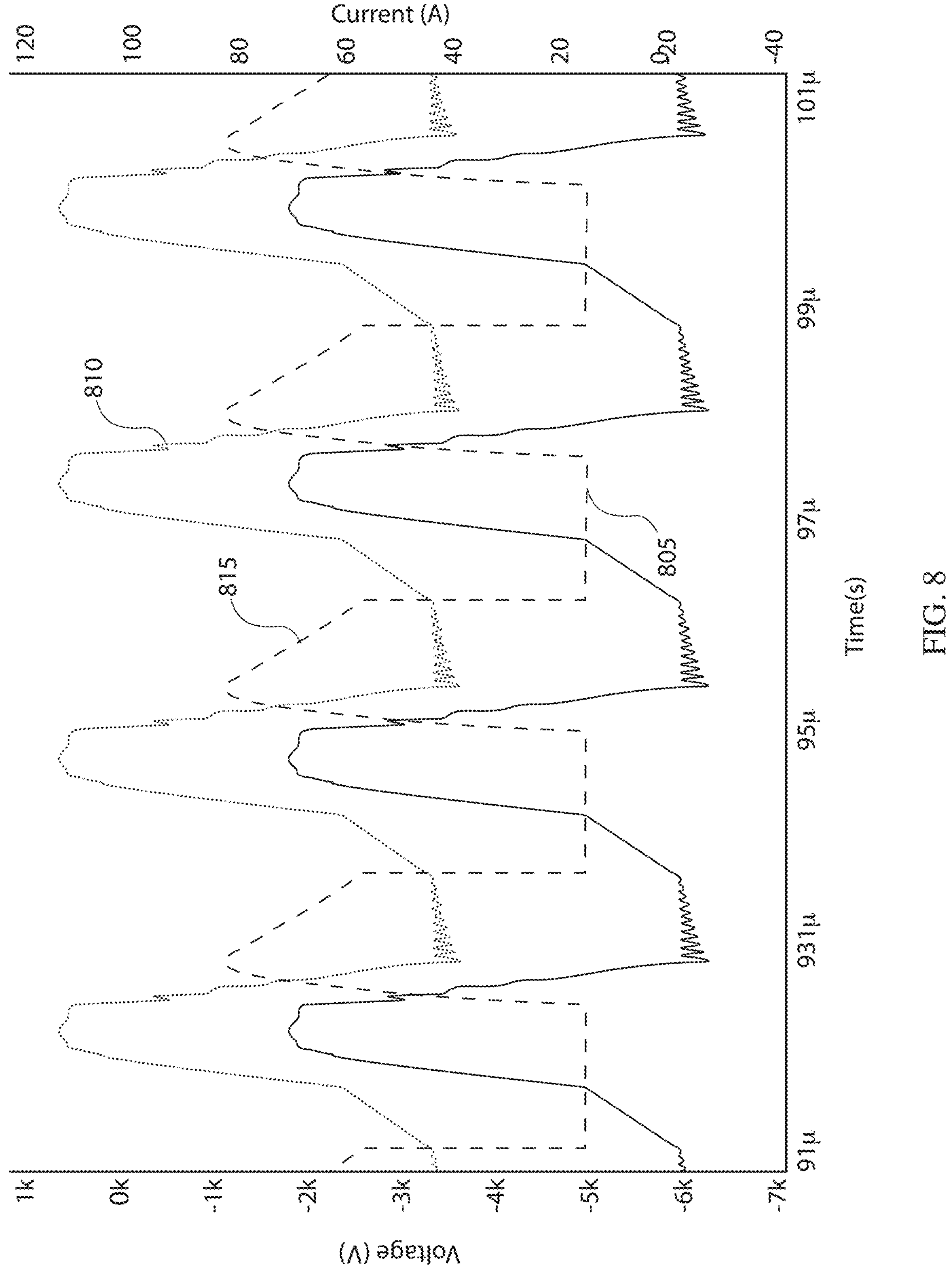
FIG. 8 are waveforms of the voltage and currents within a nanosecond pulser system.

FIG. 8 are waveforms of the voltage and current within the matchless driver system 700. The waveform 805 represents the voltage on the wafer measured at the point labeled 124 (e.g., on the electrode). The waveform 810 represents the voltage into the load stage 106 measured at the position labeled 122 (e.g., on the wafer). The waveform 815 represents the current through the energy recovery diode 120.

Figure 9:
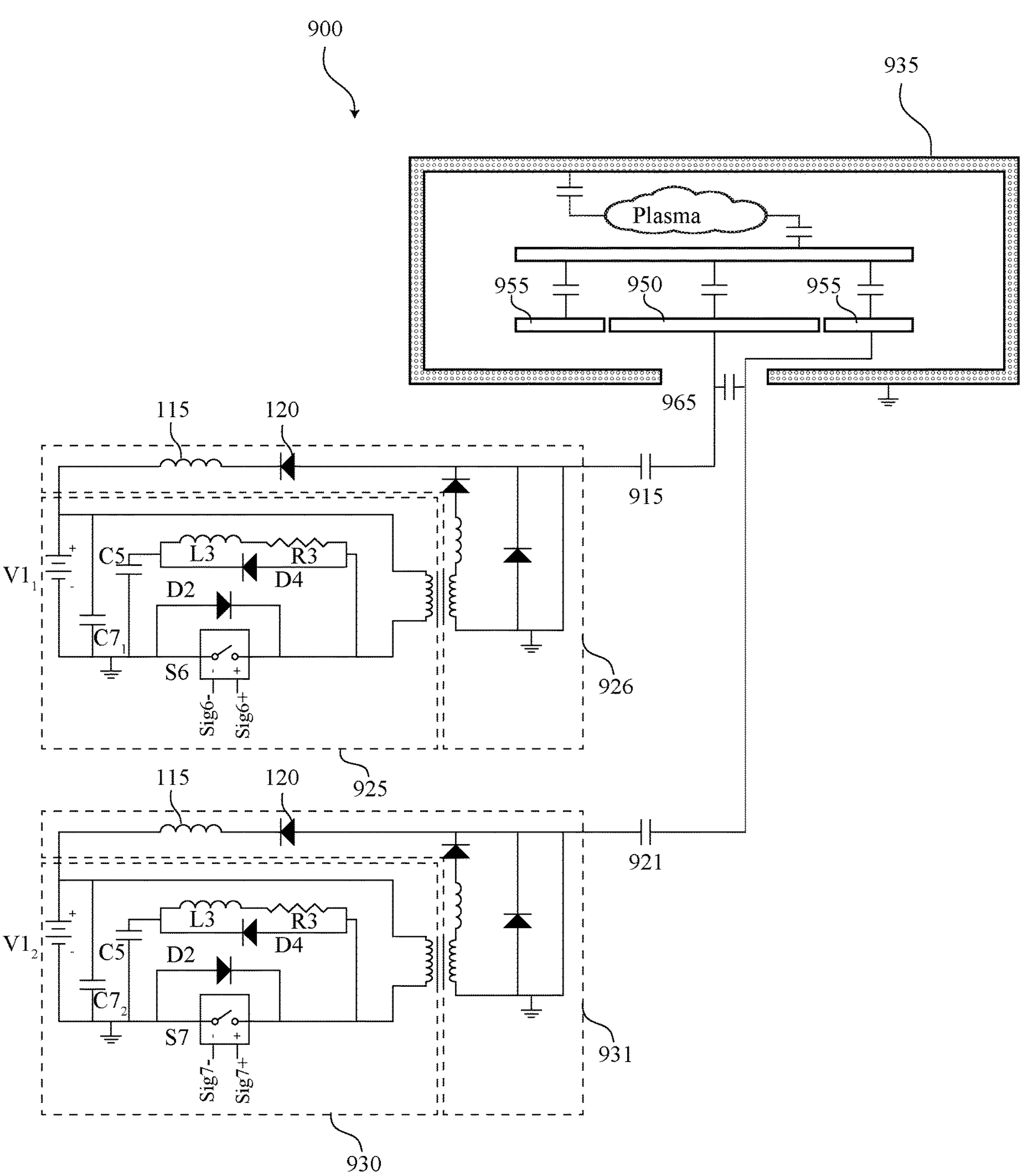
FIG. 9 is a schematic of a spatially variable wafer bias system according to some embodiments.

FIG. 9 is a schematic of a spatially variable wafer bias system 900 according to some embodiments. The spatially variable wafer bias system 900 may include a first high voltage pulser 925 coupled with a first energy recovery circuit 926 and a second high voltage pulser 930 coupled with a second energy recovery circuit coupled with a plasma chamber 935. Either or both the first energy recovery circuit 926 and the second energy recovery circuit 931 may include all or some of the components of energy recovery circuit 110 or the active energy recovery circuit 111.

In this example, the first high voltage pulser 925 is coupled with the first energy recovery circuit 926 and a first bias capacitor 915, and/or the second high voltage pulser 930 is coupled with a second energy recovery circuit 931 and a second bias capacitor 921.

A first electrode 950 and a second electrode 955 may be disposed in the plasma chamber 935. In this example, the first electrode 950 is disc shaped and disposed within a central aperture of the second electrode 955. The first high voltage pulser 925 is electrically coupled with the first electrode 950 and the second high voltage pulser 930 is electrically coupled with the second electrode 955. In some embodiments, a stray coupling capacitance 965 can exist between the first high voltage pulser 925 and the second high voltage pulser 930. The stray coupling capacitance 965, for example, may be less than about 100 pF, about 1 nF, about 10 nF, etc.

In some embodiments, either or both the first high voltage pulser 925 and the second high voltage pulser 930 may be coupled with a bias circuit such as, for example, DC bias circuit 104, passive bias compensation circuit 114, or the active bias compensation circuit 134.

In some embodiments, the energy storage capacitor C71 in the first nanosecond pulser 925 can be coupled with a first DC power supply and the energy storage capacitor C71 in the second nanosecond pulser 930 may be coupled with a second DC power supply.

In some embodiments, the energy storage capacitor C72 in the first nanosecond pulser 925 and the energy storage capacitor C72 in the second nanosecond pulser 930 may be coupled with a single DC power supply.

In some embodiments, both the first nanosecond pulser 925 and the second nanosecond pulser 930 may be coupled with the same energy storage capacitor, which may be coupled with a DC power supply.

In some embodiments, the switch S6 may be turned on for a different period of time than switch S7. The amount of time a switch is closed may correspond to the voltage applied to the respective electrode. In order to provide different voltages to different electrodes, each switch may be turned on for a different period of time.

Either or both the first nanosecond pulser 925 and the second nanosecond pulser 930 may include a passive bias compensation circuit 114, an active bias compensation circuit 134, or a DC bias circuit 104.

Figure 10:
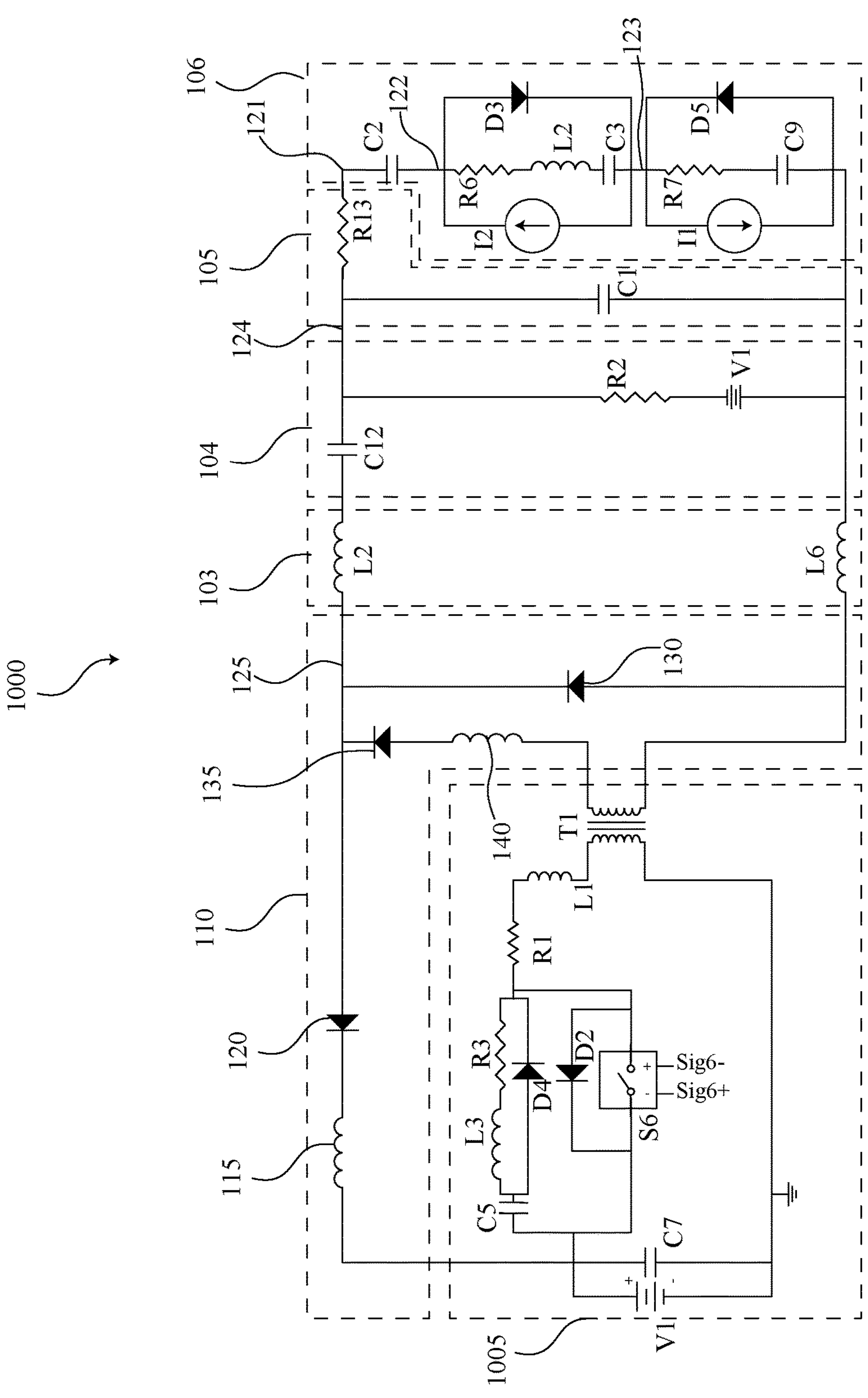
FIG. 10 is a circuit diagram of a nanosecond pulser system with the energy recovery circuit according to some embodiments.

FIG. 10 is a circuit diagram of a nanosecond pulser system 1000 with the energy recovery circuit 110 according to some embodiments. In this example, the nanosecond pulser system 1005 is similar to the nanosecond pulser system 100 with the nanosecond pulser stage 101 switching the other polarity of the energy storage capacitor C7. When switch S6 is open, charge on the capacitor C1 flows through the energy recovery circuit 110 to the high voltage energy storage capacitor C7 and may charge the high voltage energy storage capacitor C7. When the charge on the capacitor C1 is less than the charge on the high voltage energy storage capacitor C7 the current stops flowing through the energy recovery circuit 110. In some embodiments, the DC bias circuit 104 may be replaced with the passive bias compensation circuit 114 or the active bias compensation circuit 134. In some embodiments, the energy recovery circuit 110 may be replaced with the active energy recovery circuit 111.

In some embodiments, a nanosecond pulser (or switches) are included that switch the ground side (see e.g., FIG. 1) or the positive side of the power supply V1 and/or C7 (see e.g., FIG. 10). Either arrangement may be used. A figure showing one arrangement may be replaced with the other arrangement.

Figure 11:
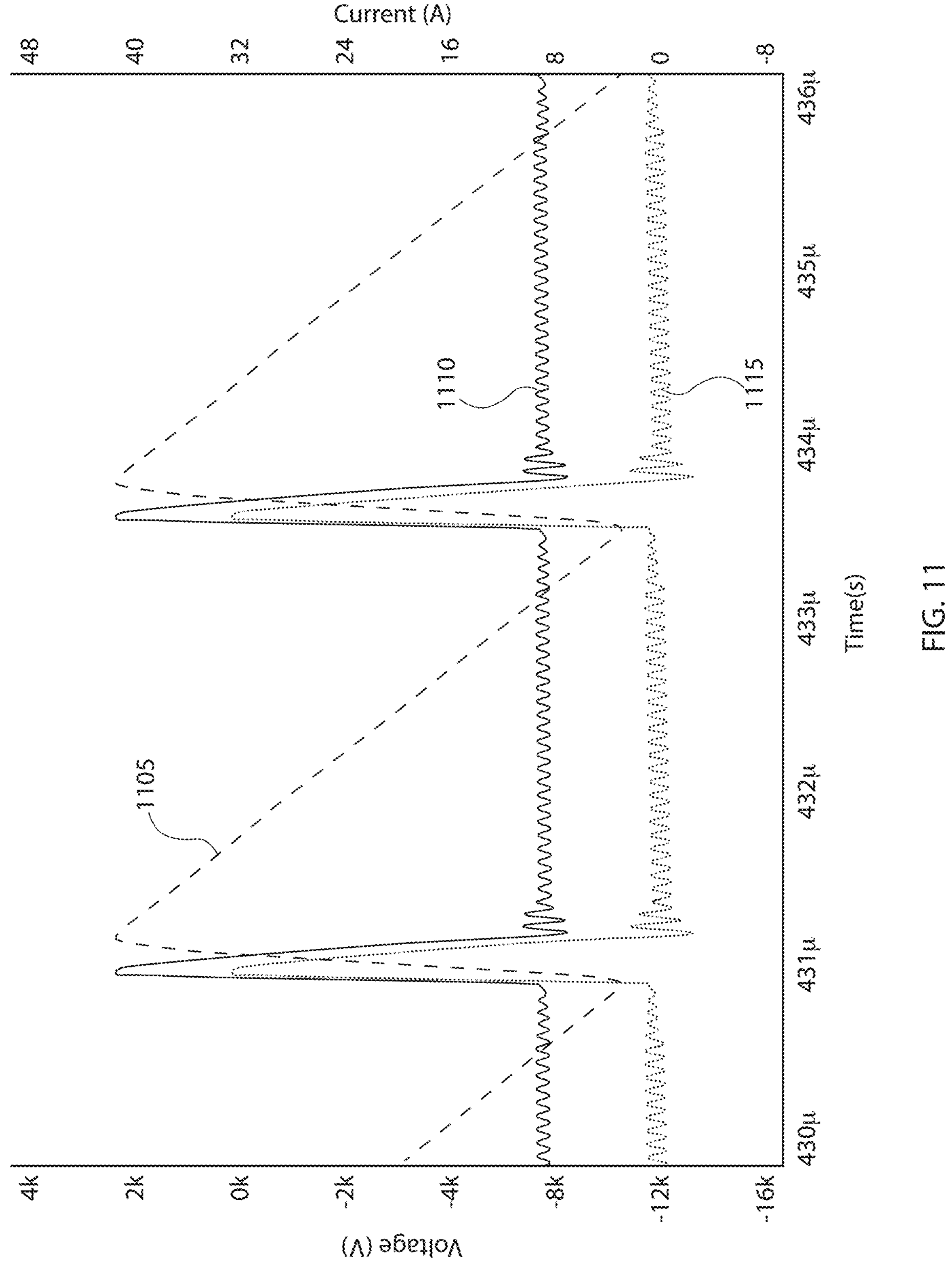
FIG. 11 illustrates waveforms of the voltage and current within a nanosecond pulser system.

FIG. 11 illustrates waveforms of the voltage and current within the nanosecond pulser system 1000 shown in FIG. 10. The waveform 1105 represents the current through the energy recovery inductor 115. The waveform 1110 represents the voltage into the load stage 106 measured at the position labeled 124 (e.g., on the electrode). The waveform 1115 represents the wafer voltage measured at the position labeled 122 (e.g., on the wafer). As shown, when the pulse is turned off, current flows through energy recovery inductor 115, which charges the high voltage energy storage capacitor C7. In this one specific example, the capacitive load is 500 pF and the energy recovery inductor 115 is 10 H.

Figure 12:
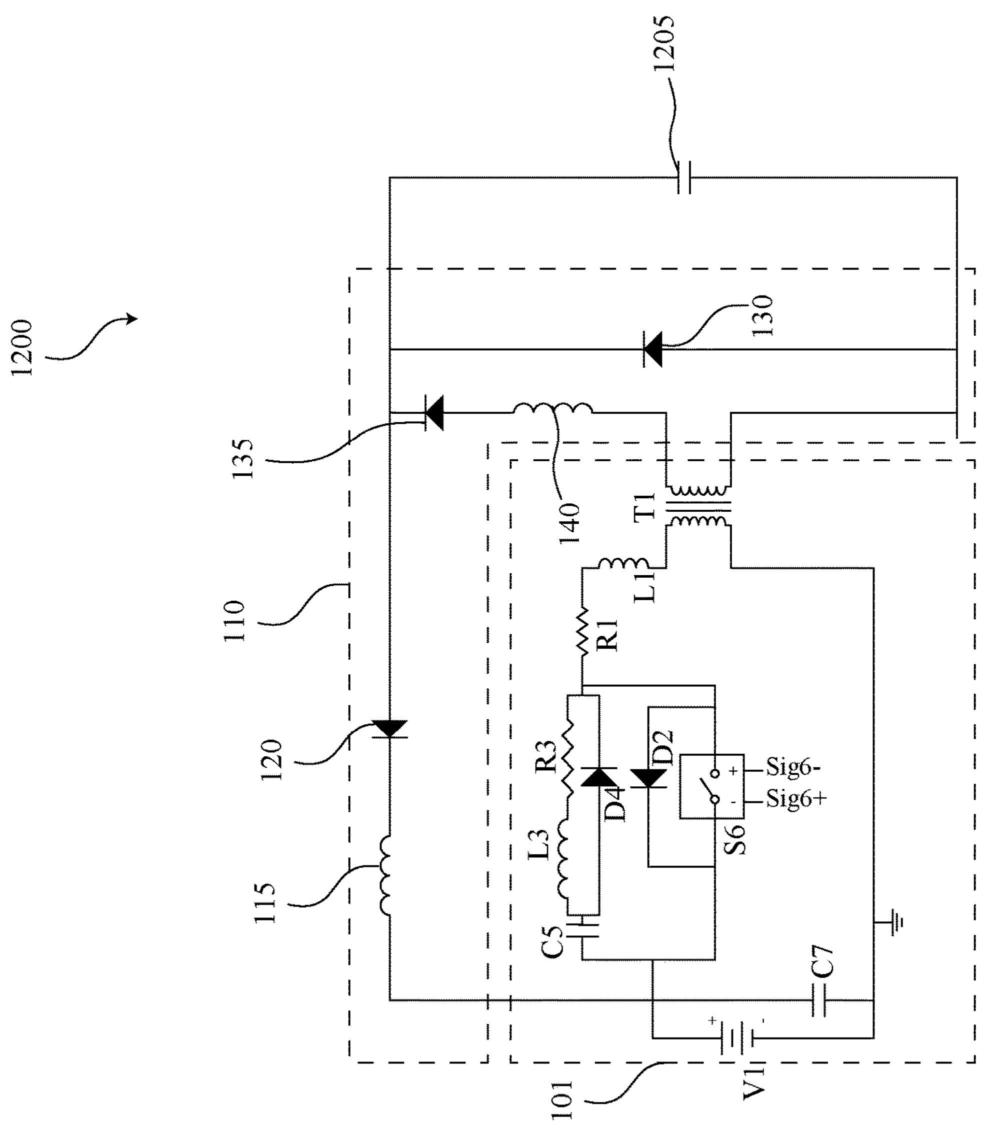
FIG. 12 is a circuit diagram of a nanosecond pulser system with the energy recovery circuit driving a capacitive load according to some embodiments.

FIG. 12 is a circuit diagram of a nanosecond pulser system 1200 with the energy recovery circuit 110 driving a capacitive load 1205 according to some embodiments. In this example, the nanosecond pulser system 1200 is similar to the nanosecond pulser system 100 without the DC bias circuit 104 and is driving a capacitive load 1205. The capacitive load 1205 may include any type of load such as, for example, a plasma load, a plurality of grids, a plurality of electrodes, physical capacitor, a photoconductive switch capacitance, etc.

Figure 13:
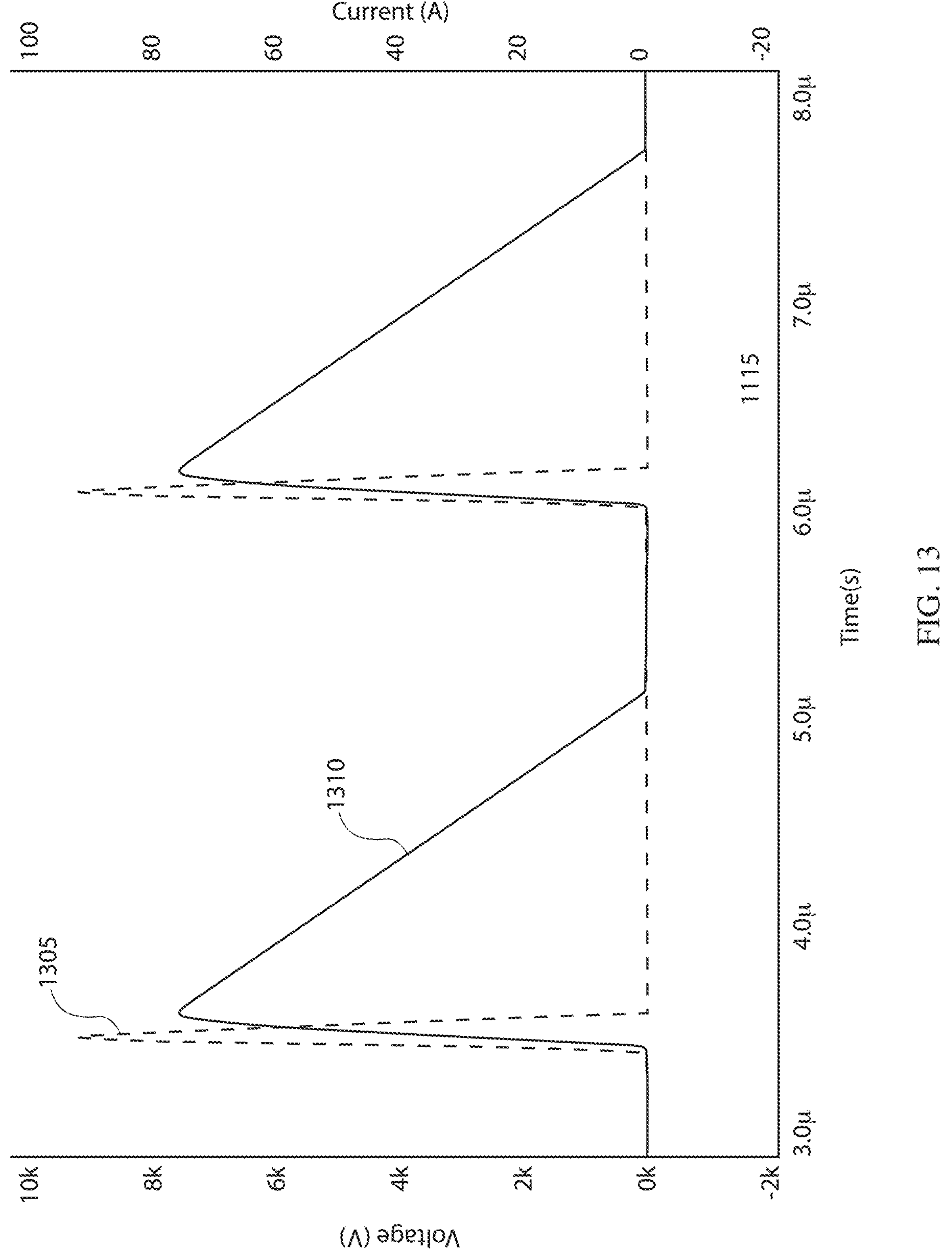
FIG. 13 illustrates waveforms of the voltage and current within the nanosecond pulser system.

FIG. 13 illustrates waveforms of the voltage and current within the nanosecond pulser system 1200 shown in FIG. 12. The waveform 1305 represents the voltage at the capacitive load 1205; and the waveform 1310 represents the current through the energy recovery inductor 115. As shown, when the pulse is turned off, current flows through energy recovery inductor 115 to charge the high voltage energy storage capacitor C7. In this one specific example, the load C1 is 500 pF and the energy recovery inductor 115 is 10 μH.

FIG. 14 is a block diagram of a high voltage switch 1400 with isolated power according to some embodiments. The high voltage switch 1400 may include a plurality of switch modules 1405 (collectively or individually 1405, and individually 1405A, 1405B, 1405C, and 1405D) that may switch voltage from a high voltage source 1460 with fast rise times and/or high frequencies and/or with variable pulse widths. Each switch module 1405 may include a switch 1410 such as, for example, a solid state switch.

In some embodiments, the switch 1410 may be electrically coupled with a gate driver circuit 1430 that may include a power supply 1440 and/or an isolated fiber trigger 1445 (also referred to as a gate trigger or a switch trigger). For example, the switch 1410 may include a collector, an emitter, and a gate (or a drain, a source, and a gate) and the power supply 1440 may drive the gate of the switch 1410 via the gate driver circuit 1430. The gate driver circuit 1430 may, for example, be isolated from the other components of the high voltage switch 1400.

In some embodiments, the power supply 1440 may be isolated, for example, using an isolation transformer. The isolation transformer may include a low capacitance transformer. The low capacitance of the isolation transformer may, for example, allow the power supply 1440 to charge on fast time scales without requiring significant current. The isolation transformer may have a capacitance less than, for example, about 100 pF. As another example, the isolation transformer may have a capacitance less than about 30-100 pF. In some embodiments, the isolation transformer may provide voltage isolation up to 1 kV, 5 kV, 10 kV, 25 kV, 50 kV, etc.

In some embodiments, the isolation transformer may have a low stray capacitance. For example, the isolation transformer may have a stray capacitance less than about 1,000 pF, 100 pF, 10 pF, etc. In some embodiments, low capacitance may minimize electrical coupling to low voltage components (e.g., the source of the input control power) and/or may reduce EMI generation (e.g., electrical noise generation). In some embodiments, the transformer stray capacitance of the isolation transformer may include the capacitance measured between the primary winding and secondary winding.

In some embodiments, the isolation transformer may be a DC to DC converter or an AC to DC transformer. In some embodiments, the transformer, for example, may include a 110 V AC transformer. Regardless, the isolation transformer can provide isolated power from other components in the high voltage switch 1400. In some embodiments, the isolation may be galvanic, such that no conductor on the primary side of the isolation transformer passes through or makes contact with any conductor on the secondary side of the isolation transformer.

In some embodiments, the transformer may include a primary winding that may be wound or wrapped tightly around the transformer core. In some embodiments, the primary winding may include a conductive sheet that is wrapped around the transformer core. In some embodiments, the primary winding may include one or more windings.

In some embodiments, a secondary winding may be wound around the core as far from the core as possible. For example, the bundle of windings comprising the secondary winding may be wound through the center of the aperture in the transformer core. In some embodiments, the secondary winding may include one or more windings. In some embodiments, the bundle of wires comprising the secondary winding may include a cross section that is circular or square, for example, to minimize stray capacitance. In some embodiments, an insulator (e.g., oil or air) may be disposed between the primary winding, the secondary winding, or the transformer core.

In some embodiments, keeping the secondary winding far from the transformer core may have some benefits. For example, it may reduce the stray capacitance between the primary side of the isolation transformer and secondary side of the isolation transformer. As another example, it may allow for high voltage standoff between the primary side of the isolation transformer and the secondary side of the isolation transformer, such that corona and/or breakdown is not formed during operation.

In some embodiments, spacings between the primary side (e.g., the primary windings) of the isolation transformer and the secondary side of the isolation transformer (e.g., the secondary windings) can be about 0.1", 0.5", 1", 5", or 10". In some embodiments, typical spacings between the core of the isolation transformer and the secondary side of the isolation transformer (e.g., the secondary windings) can be about 0.1", 0.5", 1", 5", or 10". In some embodiments, the gap between the windings may be filled with the lowest dielectric material possible such as, for example, vacuum, air, any insulating gas or liquid, or solid materials with a relative dielectric constant less than 3.

In some embodiments, the power supply 1440 may include any type of power supply that can provide high voltage standoff (isolation) or have low capacitance (e.g., less than about 1,000 pF, 100 pF, 10 pF, etc.). In some embodiments, the control voltage power source may supply 1420 V AC or 240 V AC at 60 Hz.

In some embodiments, each power supply 1440 may be inductively electrically coupled with a single control voltage power source. For example, the power supply 1440A may be electrically coupled with the power source via a first transformer; the power supply 1440B may be electrically coupled with the power source via a second transformer; the power supply 1440C may be electrically coupled with the power source via a third transformer; and the power supply 1440D may be electrically coupled with the power source via a fourth transformer. Any type of transformer, for example, may be used that can provide voltage isolation between the various power supplies.

In some embodiments, the first transformer, the second transformer, the third transformer, and the fourth transformer may comprise different secondary winding around a core of a single transformer. For example, the first transformer may comprise a first secondary winding, the second transformer may comprise a second secondary winding, the third transformer may comprise a third secondary winding, and the fourth transformer may comprise a fourth secondary winding. Each of these secondary winding may be wound around the core of a single transformer. In some embodiments, the first secondary winding, the second secondary winding, the third secondary winding, the fourth secondary winding, or the primary winding may comprise a single winding or a plurality of windings wound around the transformer core.

In some embodiments, the power supply 1440A, the power supply 1440B, the power supply 1440C, and/or the power supply 1440D may not share a return reference ground or a local ground.

The isolated fiber trigger 1445, for example, may also be isolated from other components of the high voltage switch 1400. The isolated fiber trigger 1445 may include a fiber optic receiver that allows each switch module 1405 to float relative to other switch modules 1405 and/or the other components of the high voltage switch 1400, and/or, for example, while allowing for active control of the gates of each switch module 1405.

In some embodiments, return reference grounds or local grounds or common grounds for each switch module 1405, for example, may be isolated from one another, for example, using an isolation transformer.

Electrical isolation of each switch module 1405 from common ground, for example, can allow multiple switches to be arranged in a series configuration for cumulative high voltage switching. In some embodiments, some lag in switch module timing may be allowed or designed. For example, each switch module 1405 may be configured or rated to switch 1 kV, each switch module may be electrically isolated from each other, and/or the timing of closing each switch module 1405 may not need to be perfectly aligned for a period of time defined by the capacitance of the snubber capacitor and/or the voltage rating of the switch.

In some embodiments, electrical isolation may provide many advantages. One possible advantage, for example, may include minimizing switch to switch jitter and/or allowing for arbitrary switch timing. For example, each switch 1410 may have switch transition jitters less than about 500 ns, 50 ns, 20 ns, 5 ns, etc.

In some embodiments, electrical isolation between two components (or circuits) may imply extremely high resistance between two components and/or may imply a small capacitance between the two components.

Each switch 1410 may include any type of solid state switching device such as, for example, an IGBT, a MOSFET, a SiC MOSFET, SiC junction transistor, FETs, SiC switches, GaN switches, photoconductive switch, etc. The switch 1410, for example, may be able to switch high voltages (e.g., voltages greater than about 1 kV), with high frequency (e.g., greater than 1 kHz), at high speeds (e.g., a repetition rate greater than about 500 kHz) and/or with fast rise times (e.g., a rise time less than about 25 ns) and/or with long pulse lengths (e.g., greater than about 10 ms). In some embodiments, each switch may be individually rated for switching 1,200 V-1,700 V, yet in combination can switch greater than 4,800 V-6,800 V (for four switches). Switches with various other voltage ratings may be used.

There may be some advantages to using a large number of lower voltage switches rather than a few higher voltage switches. For example, lower voltage switches typically have better performance: lower voltage switches may switch faster, may have faster transition times, and/or may switch more efficiently than high voltage switches. However, the greater the number of switches, for example, the greater the need for switch timing precision.

The high voltage switch 1400 shown in FIG. 14 includes four switch modules 1405. While four are shown in this figure, any number of switch modules 1405 may be used such as, for example, two, eight, twelve, sixteen, twenty, twenty-four, etc. For example, if each switch in each switch module 1405 is rated at 1200 V, and sixteen switches are used, then the high voltage switch can switch up to 19.2 kV. As another example, if each switch in each switch module 1405 is rated at 1700 V, and sixteen switches are used, then the high voltage switch can switch up to 27.2 kV.

In some embodiments, the high voltage switch 1400 may switch voltages greater than 5 kV, 10 kV, 14 kV, 20 kV, 25 kV, etc.

In some embodiments, the high voltage switch 1400 may include a fast capacitor 1455. The fast capacitor 1455, for example, may include one or more capacitors arranged in series and/or in parallel. These capacitors may, for example, include one or more polypropylene capacitors. The fast capacitor 1455 may store energy from the high voltage source 1460.

In some embodiments, the fast capacitor 1455 may have low capacitance. In some embodiments, the fast capacitor 1455 may have a capacitance value of about 1 μF, about 5 μF, between about 1 μF and about 5 μF, between about 100 nF and about 1,000 nF etc.

In some embodiments, the high voltage switch 1400 may or may not include a crowbar diode 1450. The crowbar diode 1450 may include a plurality of diodes arranged in series or in parallel that may, for example, be beneficial for driving inductive loads. In some embodiments, the crowbar diode 1450 may include one or more Schottky diodes such as, for example, a silicon carbide Schottky diode. The crowbar diode 1450 may, for example, sense whether the voltage from the switches of the high voltage switch is above a certain threshold. If it is, then the crowbar diode 1450 may short the power from switch modules to ground. The crowbar diode, for example, may allow an alternating current path to dissipate energy stored in the inductive load after switching. This may, for example, prevent large inductive voltage spikes. In some embodiments, the crowbar diode 1450 may have low inductance such as, for example, 1 nH, 10 nH, 100 nH, etc. In some embodiments, the crowbar diode 1450 may have low capacitance such as, for example, 100 pF, 1 nF, 10 nF, 100 nF, etc.

In some embodiments, the crowbar diode 1450 may not be used such as, for example, when the load 1465 is primarily resistive.

In some embodiments, each gate driver circuit 1430 may produce less than about 1000 ns, 100 ns, 10.0 ns, 5.0 ns, 3.0 ns, 1.0 ns, etc. of jitter. In some embodiments, each switch 1410 may have a minimum switch on time (e.g., less than about 10 μs, 1 μs, 500 ns, 100 ns, 50 ns, 10, 5 ns, etc.) and a maximum switch on time (e.g., greater than 25 s, 10 s, 5 s, 1 s, 500 ms, etc.).

In some embodiments, during operation each of the high voltage switches may be switched on and/or off within 1 ns of each other.

In some embodiments, each switch module 1405 may have the same or substantially the same (±5%) stray inductance. Stray inductance may include any inductance within the switch module 1405 that is not associated with an inductor such as, for example, inductance in leads, diodes, resistors, switch 1410, and/or circuit board traces, etc. The stray inductance within each switch module 1405 may include low inductance such as, for example, an inductance less than about 300 nH, 100 nH, 10 nH, 1 nH, etc. The stray inductance between each switch module 1405 may include low inductance such as, for example, an inductance less than about 300 nH, 100 nH, 10 nH, 1 nH, etc.

In some embodiments, each switch module 1405 may have the same or substantially the same (±5%) stray capacitance. Stray capacitance may include any capacitance within the switch module 1405 that is not associated with a capacitor such as, for example, capacitance in leads, diodes, resistors, switch 1410 and/or circuit board traces, etc. The stray capacitance within each switch module 1405 may include low capacitance such as, for example, less than about 1,000 pF, 100 pF, 10 pF, etc. The stray capacitance between each switch module 1405 may include low capacitance such as, for example, less than about 1,000 pF, 100 pF, 10 pF, etc.

Imperfections in voltage sharing can be addressed, for example, with a passive snubber circuit (e.g., the snubber diode 1415, the snubber capacitor 1420, and/or the freewheeling diode 1425). For example, small differences in the timing between when each of the switches 1410 turn on or turn off or differences in the inductance or capacitances may lead to voltage spikes. These spikes can be mitigated by the various snubber circuits (e.g., the snubber diode 1415, the snubber capacitor 1420, and/or the freewheeling diode 1425).

A snubber circuit, for example, may include a snubber diode 1415, a snubber capacitor 1420, a snubber resistor 1416, and/or a freewheeling diode 1425. In some embodiments, the snubber circuit may be arranged together in parallel with the switch 1410. In some embodiments, the snubber capacitor 1420 may have low capacitance such as, for example, a capacitance less than about 100 pF.

In some embodiments, the high voltage switch 1400 may be electrically coupled with or include a load 1465 (e.g., a resistive or capacitive or inductive load). The load 1465, for example, may have a resistance from 50 ohms to 500 ohms. Alternatively or additionally, the load 1465 may be an inductive load or a capacitive load.

In some embodiments, the energy recovery circuit 110 or the active energy recovery circuit 111 can decrease the energy consumption of a high voltage nanosecond pulser system and/or the voltage required to drive a given load with the same energy output performance as systems without an energy recover circuit. For example, the energy consumption, for the same energy output performance as systems without an energy recover circuit, can be reduced as much as 10%, 15%20%, 25%, 30%, 40%, 45%, 50%, etc. or more.

In some embodiments, the diode 130, the diode 135, and/or the energy recovery diode 120 may comprise a high voltage diode.

Figure 15:
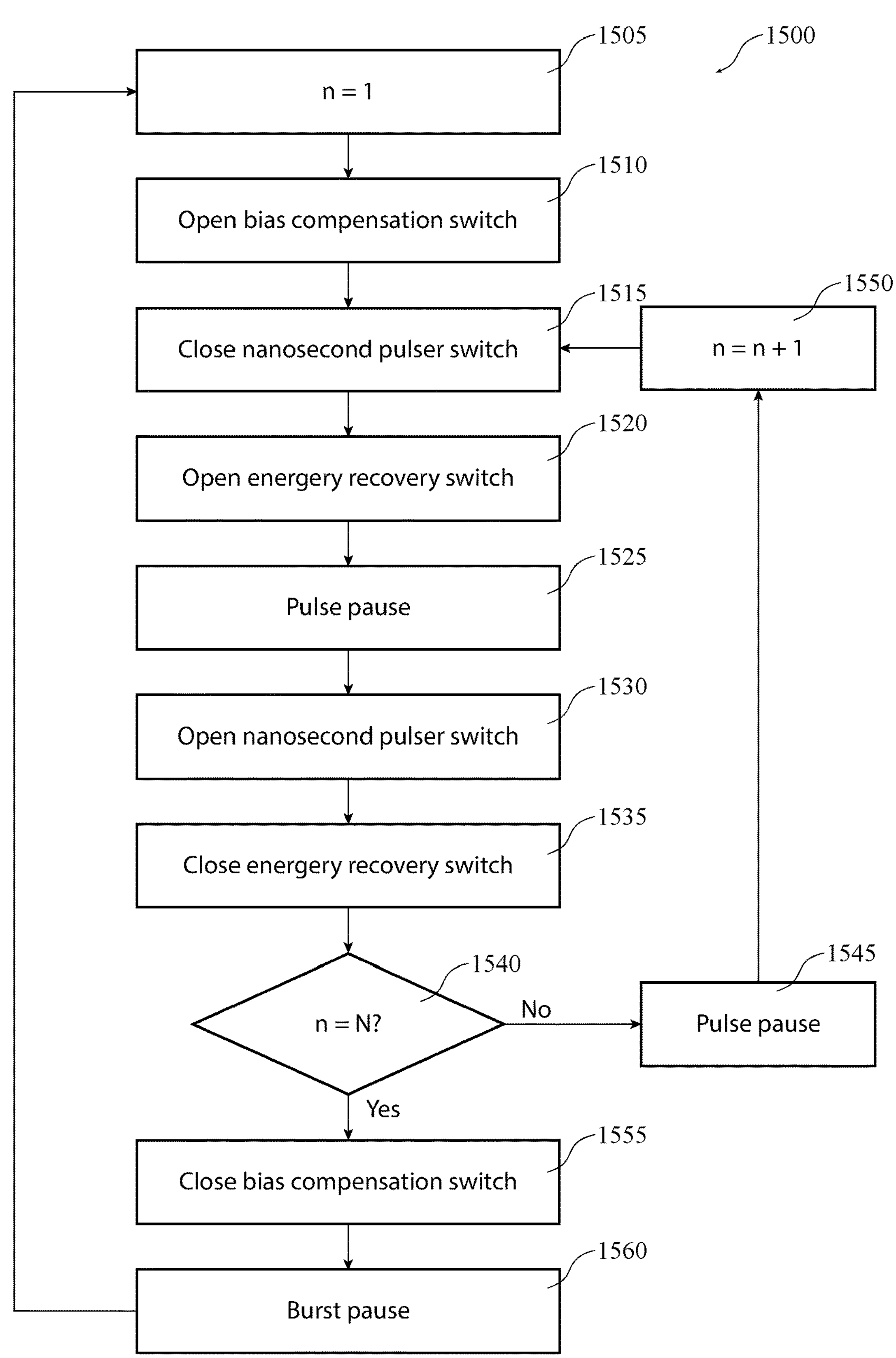
FIG. 15 is a block diagram of a process for operating a nanosecond pulser system with an active energy recovery circuit and an active bias compensation circuit according to some embodiments.

FIG. 15 is a block diagram of a process 1500 for operating a nanosecond pulser system with an active energy recovery circuit and an active bias compensation circuit according to some embodiments. The process 1500 may include additional blocks. The blocks shown in the process 1500 may be removed, replaced, skipped, or performed in any order.

The process 1500, for example, may be executed using the nanosecond pulser system 600 with the active energy recovery circuit 111 and the active bias compensation circuit 134 or similar circuits.

In some embodiments, a nanosecond pulser may be used to produce a plurality of bursts, where each burst includes a plurality of pulses. A pulse can be produced by turning the switches of a nanosecond pulser on and off. The pulse width of each pulse, for example, may vary from 10 seconds to 10 ns. The pulse frequency, for example, may vary from 10 kHz to 1 MHz such as, for example, 400 kHz. Each burst may include a set number of pulses. Each burst may have a burst width, which defines the time to complete a plurality of pulses.

The process 1500 may begin at block 1505 where the counter n is set initialized to 1. The counter n counts the number of pulses in a given burst.

At block 1510 the bias compensation switch (e.g., switch S8) may be opened.

At block 1515 the nanosecond pulser switch (e.g., switch S6) may be closed.

At block 1520 the energy recovery switch (e.g., switch S5) may be opened.

In some embodiments, the blocks 1510, 1515, and 1520 may occur at substantially the same time or within 10 ns or 100 ns, etc. In some embodiments, the blocks 1515 and 1520 may occur at substantially the same time.

At block 1525, the process 1500 may pause (e.g., a pulse) for a time period that defines the pulse width of each pulse. In some embodiments, the pulse width of a pulse may define the voltage of the pulse at the load such as, for example, a capacitive load by defining the amount of time the load is charged to a particular voltage. The output voltage at a capacitive load produced by a pulse, for example, may depend on the amount of time the nanosecond pulser switch is closed and, therefore, the amount of time the pulse is charging the capacitive load. Thus, the output voltage at the load of the pulse may be defined by the voltage pause time period up to the maximum output voltage of the nanosecond pulser or some multiple of the maximum output voltage of the nanosecond pulser if it is pulsing into an inductor and/or capacitor that produces some voltage ring up. The voltage pause, for example, may be about 10 ns-about 500 ns nanoseconds or about 50 ns to about 200 ns, or 500 ns, 73.75 ns, 27 ns, 16 ns, or 12.5 ns.

At block 1530 the nanosecond pulser switch (e.g., switch S6) may be opened.

At block 1535 the energy recovery switch (e.g., switch S5) may be closed.

In some embodiments, the blocks 1530 and 1535 may occur at substantially the same time.

At block 1540 it can be determined whether counter n is equal to the number of desired pulses N. While there is no limit to the number of pulses within a burst, the number of desired pulses N, for example, may be 5-1,000. In some embodiments, the pulses may run continuously. As such N may be nearly infinite. If the counter n is not equal to the number of desired pulses N (i.e., fewer than the desired number of pulses have occurred in the burst) then process 1500 proceeds to block 1545.

At block 1545, the process 1500 may pause for a period of time (e.g., pulse pause) that may, in part, define the pulse frequency. For example, the pulse pause time period may be less than 500 ns, 250 ns, 100 ns, 50 ns, 10 ns, 5 ns, etc. The pulse pause time period, for example, may include any time period.

At block 1550, the counter n is incremented, and portions of process 1500 may repeat by proceed to block 1515 to create an additional pulse. At block 1540, if the counter n is equal to the number of desired pulses N (i.e., the desired number of pulses have been created then process 1500 proceeds to block 1555. At block 1555 the bias compensation switch (e.g., switch S8) may be closed.

At block 1560, the process 1500 pauses for a time period (e.g., burst pause) that defines the amount of time between bursts. The burst pause time period may, for example, be as small as 1 ms or as long as 20 seconds. For example, the pulse pause may include a time period between 2.5 microseconds (pulse frequency of 200 Hz) and 100 ms. As another example, the pulse pause may be from 10 ms to a number of hours. Any other time period may be used. After the time period has passed, process 1500 may return to block 1505 where counter n is initialized and the process 1500 may be repeated to create an additional burst with additional pulses.

When the nanosecond pulser switch is closed, the energy recover switch is open, and the bias compensation switch is open, a high voltage pulse (e.g., greater than 1 kV) may be produced at the circuit position 124.

In some embodiments, the pulse pause time period may be less than the burst pause time period.

In some embodiments, block 1520 and block 1535 may be eliminated from process 1500. In such embodiments, when the energy recovery switch is not used, the nanosecond pulser switch is closed and the bias compensation switch is open, a high voltage pulse (e.g., greater than 1 kV) may be produced at the circuit position 124.

Figure 16:
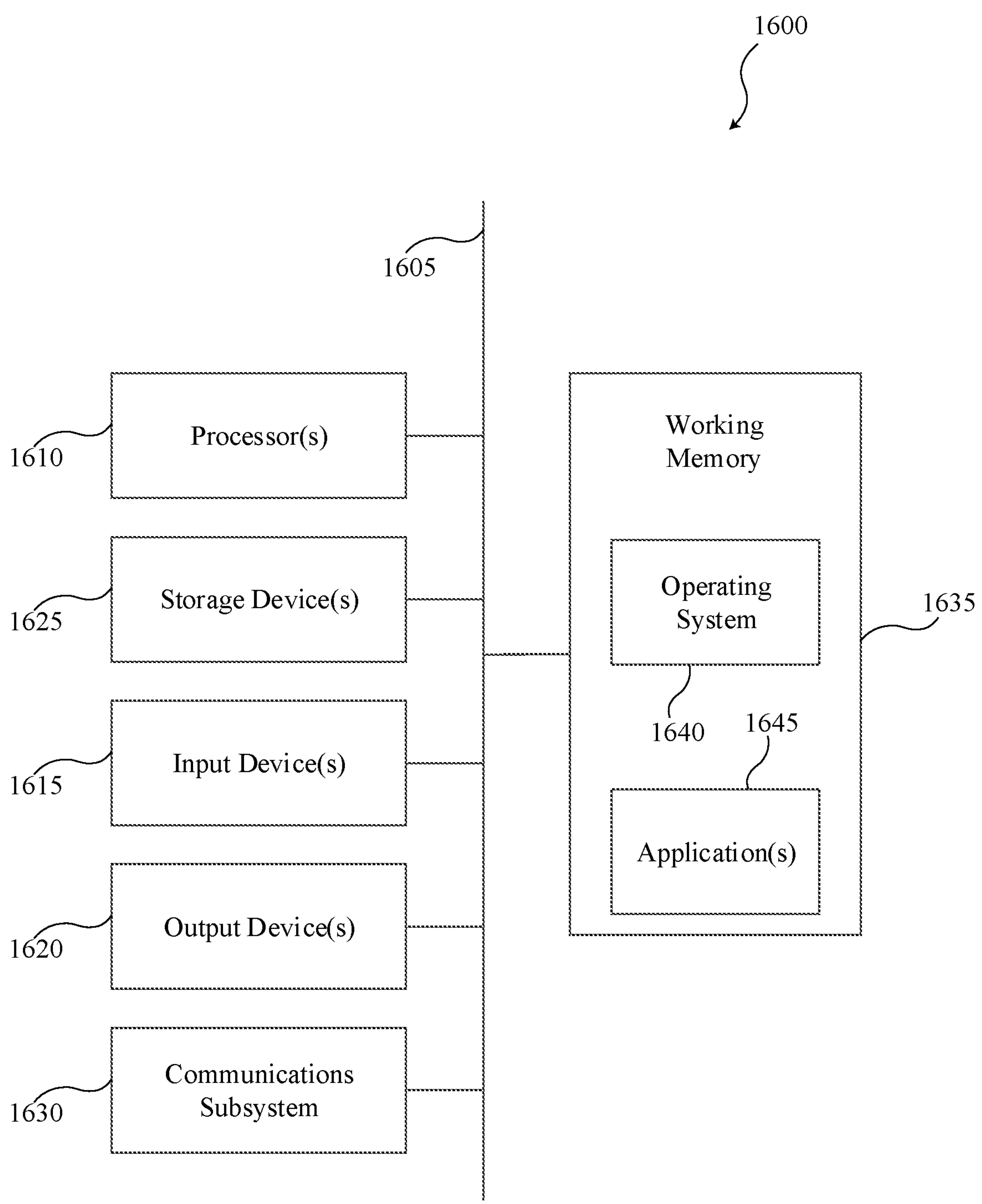
FIG. 16 shows an illustrative computational system for performing functionality to facilitate implementation of embodiments described herein.

In some embodiments, the blocks of process 1500 may be executed using a controller (or processor) such as, for example, the computational system 1600, shown in FIG. 16. The controller, for example, may be in communication with switch S6 via Sig6+ and Sig6−, bias compensation switch S8 via Sig8+ and Sig8−, and/or energy recovery switch S5 via Sig5+ and Sig5−. The controller may provide signals that open and close the nanosecond pulser switch, the energy recovery switch, and/or the bias compensation switch.

The computational system 1600, shown in FIG. 16 can be used to perform any of the embodiments of the invention. For example, computational system 1600 can be used to execute process 1500. As another example, computational system 1600 can be used perform any calculation, identification and/or determination described here. Computational system 1600 includes hardware elements that can be electrically coupled via a bus 1605 (or may otherwise be in communication, as appropriate). The hardware elements can include one or more processors 1610, including without limitation one or more general-purpose processors and/or one or more special-purpose processors (such as digital signal processing chips, graphics acceleration chips, and/or the like); one or more input devices 1615, which can include without limitation a mouse, a keyboard and/or the like; and one or more output devices 1620, which can include without limitation a display device, a printer and/or the like.

The computational system 1600 may further include (and/or be in communication with) one or more storage devices 1625, which can include, without limitation, local and/or network accessible storage and/or can include, without limitation, a disk drive, a drive array, an optical storage device, a solid-state storage device, such as a random access memory ("RAM") and/or a read-only memory ("ROM"), which can be programmable, flash-updateable and/or the like. The computational system 1600 might also include a communications subsystem 1630, which can include without limitation a modem, a network card (wireless or wired), an infrared communication device, a wireless communication device and/or chipset (such as a Bluetooth device, an 802.6 device, a Wi-Fi device, a WiMax device, cellular communication facilities, etc.), and/or the like. The communications subsystem 1630 may permit data to be exchanged with a network (such as the network described below, to name one example), and/or any other devices described herein. In many embodiments, the computational system 1600 will further include a working memory 1635, which can include a RAM or ROM device, as described above.

The computational system 1600 also can include software elements, shown as being currently located within the working memory 1635, including an operating system 1640 and/or other code, such as one or more application programs 1645, which may include computer programs of the invention, and/or may be designed to implement methods of the invention and/or configure systems of the invention, as described herein. For example, one or more procedures described with respect to the method(s) discussed above might be implemented as code and/or instructions executable by a computer (and/or a processor within a computer). A set of these instructions and/or codes might be stored on a computer-readable storage medium, such as the storage device(s) 1625 described above.

In some cases, the storage medium might be incorporated within the computational system 1600 or in communication with the computational system 1600. In other embodiments, the storage medium might be separate from a computational system 1600 (e.g., a removable medium, such as a compact disc, etc.), and/or provided in an installation package, such that the storage medium can be used to program a general-purpose computer with the instructions/code stored thereon. These instructions might take the form of executable code, which is executable by the computational system 1600 and/or might take the form of source and/or installable code, which, upon compilation and/or installation on the computational system 1600 (e.g., using any of a variety of generally available compilers, installation programs, compression/decompression utilities, etc.) then takes the form of executable code.

FIG. 17 is a schematic of a spatially variable wafer bias system 1700 according to some embodiments. The spatially variable wafer bias system 1700 may include the first high voltage pulser 1725, a second high voltage pulser 1730, a first energy recovery circuit 1726, and a second energy recovery circuit 1731. Both the first energy recovery circuit 1726, and the second energy recovery circuit 1731 are coupled with a single energy storage capacitor C7. In some embodiments, each of the energy recovery circuit 1726 or the energy recovery circuit 1731 may include one or more diodes and/or inductors coupled with the secondary side of each transformer. In some embodiments, the energy recovery circuit 1726 or the energy recovery circuit 1731 may include a switch (e.g., as described above) to allow current to flow through the energy recovery circuit after each pulse.

Figure 18:
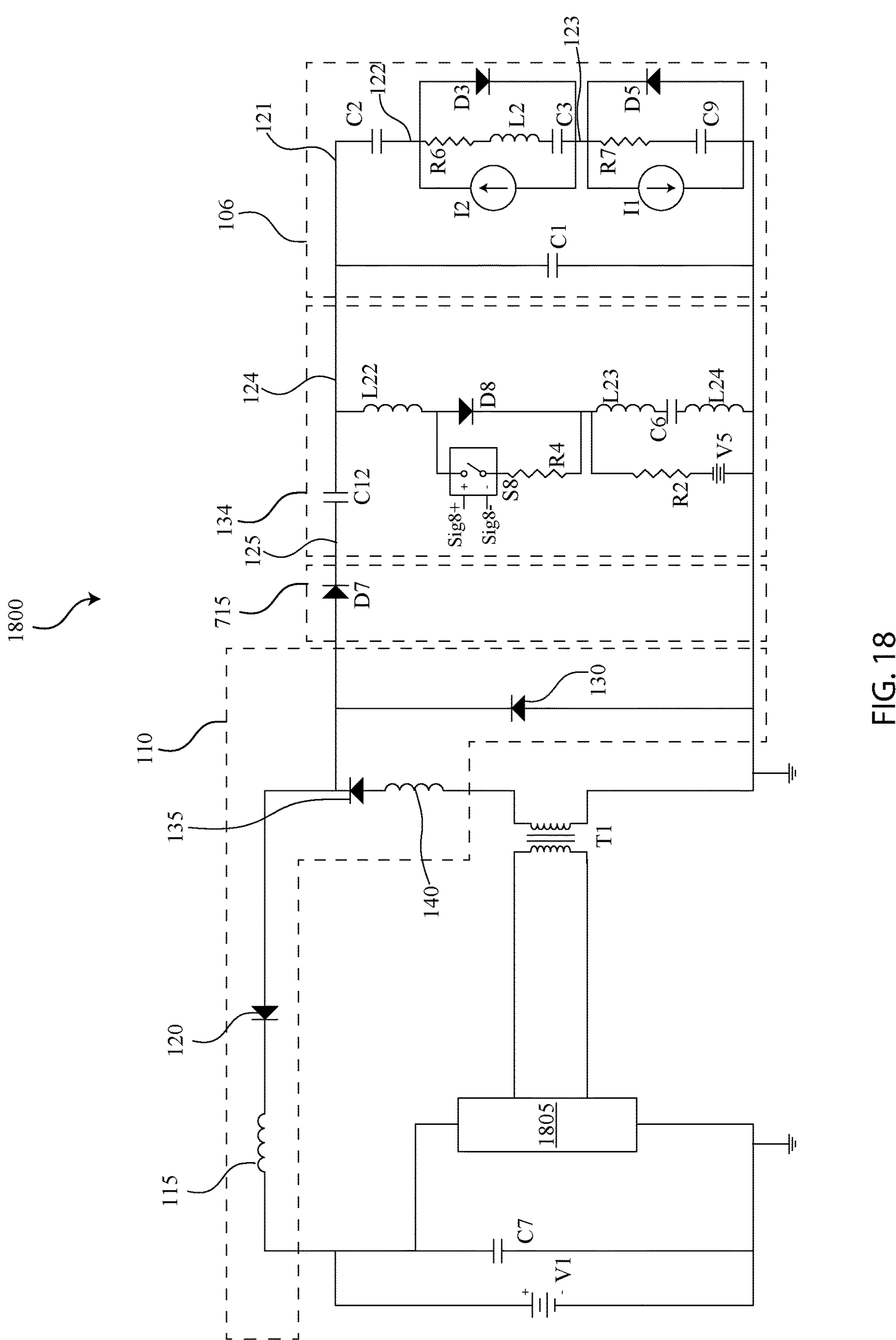
FIG. 18 is a circuit diagram of an RF driver system that includes an RF driver, the active bias compensation circuit, and the energy recovery circuit according to some embodiments.

FIG. 18 is a circuit diagram of an RF driver system 1800 that includes an RF driver 1805, the active bias compensation circuit 134, and the energy recovery circuit 110 according to some embodiments. In this example, the RF driver system 1800 is similar to the matchless RF system 700 with the RF driver 705 and resonant circuit 710 replaced by a RF driver 1805. The RF driver 705 shown in FIG. 7 comprises a full wave rectifier and a resonant circuit 710, which is replaced with a RF driver 1805.

In some embodiments, the RF driver 1805 may include a plurality of high frequency solid state switch(es), an RF generator, an amplifier tube based RF generator, or a tube based RF generator.

The RF driver system 1800 may not include a traditional matching network such as, for example, a 50 ohm matching network or an external matching network or standalone matching network. In some embodiments, the RF driver system 1800 does not require a 50 ohm matching network to optimize the switching power applied to the wafer chamber. An RF generator without a traditional matching network can allow for rapid changes to the power drawn by the plasma chamber. Typically, this optimization of the matching network can take at least 100 μs-200 μs. In some embodiments, power changes can occur within one or two RF cycles, for example, 2.5 μs-5.0 μs at 400 kHz.

In some embodiments, the RF driver 1805 may operate at frequency about 400 kHz, 0.5 MHz, 2.0 MHz, 4.0 MHz, 13.56 MHz, 27.12 MHz, 40.68 MHz, 50 MHz, etc.

Either or both the first nanosecond pulser 1725 and the second nanosecond pulser 1730 may include a passive bias compensation circuit 114, an active bias compensation circuit 134, or a DC bias circuit 104.

Unless otherwise specified, the term "substantially" means within 5% or 10% of the value referred to or within manufacturing tolerances. Unless otherwise specified, the term "about" means within 5% or 10% of the value referred to or within manufacturing tolerances.

The term "or" is inclusive.

Numerous specific details are set forth herein to provide a thorough understanding of the claimed subject matter. However, those skilled in the art will understand that the claimed subject matter may be practiced without these specific details. In other instances, methods, apparatuses or systems that would be known by one of ordinary skill have not been described in detail so as not to obscure claimed subject matter.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude inclusion of such modifications, variations and/or additions to the present subject matter as would be readily apparent to one of ordinary skill in the art.

That which is claimed:

1. A method comprising:

closing one or more switches to create a first pulse, the one or more switches are coupled with an energy storage capacitor and a primary side of a transformer, wherein the first pulse has a voltage greater than about 1 kV and pulse width less than about 1,000 ns, and the first pulse is introduced into a plasma deposition chamber via a secondary side of the transformer;

opening the one or more switches for period of time less than about 100 microseconds and allowing charge from the plasma deposition chamber to flow through an energy recovery circuit to the energy storage capacitor;

closing the one or more switches to create a second pulse that is introduced into the plasma deposition chamber via a secondary side of the transformer; and opening the one or more switches for period of time less than about 100 microseconds and allowing charge from the plasma deposition chamber to flow through the energy recovery circuit to the energy storage capacitor.

2. The method according to claim 1, wherein the energy recovery circuit comprises an inductor and a diode in series.

3. The method according to claim 1, wherein charge flows from the plasma deposition chamber to the energy storage capacitor when the charge t of the plasma deposition chamber is greater than the charge of the energy storage capacitor.

4. The method according to claim 1, further comprising:

opening a bias compensation switch that is electrically coupled with the secondary side of the transformer and the plasma deposition chamber at substantially the same time when the one or more switches are closed; and closing the bias compensation switch at substantially the same time when the one or more switches are open.

5. The method according to claim 1, further comprising:

opening an energy recovery switch within the energy recovery circuit at substantially the same time when the one or more switches are closed; and closing the energy recovery switch at substantially the same time when the one or more switches are open.

* * * * *